United States Patent [19]
Cleereman et al.

[11] Patent Number: 6,026,220
[45] Date of Patent: Feb. 15, 2000

[54] METHOD AND APPARATUS FOR INCREMNTALLY OPTIMIZING A CIRCUIT DESIGN

[75] Inventors: Kevin C. Cleereman, Moundsview; Kenneth E. Merryman, Fridley; Steve D. Thatcher, Hugo, all of Minn.

[73] Assignee: Unisys Corporation, Blue Bell, Pa.

[21] Appl. No.: 08/752,617

[22] Filed: Nov. 19, 1996

[51] Int. Cl.[7] .................................................. G06F 17/50
[52] U.S. Cl. .................................. 395/500.04; 395/500.11
[58] Field of Search ............................... 364/489, 488, 364/490, 491; 395/500

[56] References Cited

U.S. PATENT DOCUMENTS

| | | | |
|---|---|---|---|
| 4,758,953 | 7/1988 | Morita et al. | 364/300 |
| 4,831,543 | 5/1989 | Mastellone | 364/489 |
| 4,918,614 | 4/1990 | Modarres et al. | 364/490 |
| 5,050,091 | 9/1991 | Rubin | 364/488 |
| 5,164,908 | 11/1992 | Igarashi | 364/491 |
| 5,175,696 | 12/1992 | Hooper et al. | 364/489 |
| 5,222,029 | 6/1993 | Hooper et al. | 364/489 |
| 5,255,363 | 10/1993 | Seyler | 395/164 |
| 5,267,175 | 11/1993 | Hooper | 364/489 |
| 5,341,309 | 8/1994 | Kawata | 364/489 |
| 5,349,659 | 9/1994 | Do et al. | 395/700 |
| 5,355,317 | 10/1994 | Talbott et al. | 384/468 |
| 5,357,440 | 10/1994 | Talbott et al. | 364/467 |
| 5,359,523 | 10/1994 | Talbott et al. | 364/468 |
| 5,359,537 | 10/1994 | Saucier et al. | 364/489 |
| 5,361,357 | 11/1994 | Kionka | 395/700 |
| 5,398,195 | 3/1995 | Kim | 364/491 |
| 5,406,497 | 4/1995 | Altheimer et al. | 364/489 |
| 5,416,721 | 5/1995 | Nishiyama et al. | 364/491 |
| 5,418,733 | 5/1995 | Kamijima | 364/490 |
| 5,418,954 | 5/1995 | Petrus | 395/700 |
| 5,440,720 | 8/1995 | Baisuck et al. | 395/500 |
| 5,483,461 | 1/1996 | Lee et al. | 364/490 |
| 5,485,396 | 1/1996 | Brasen et al. | 364/491 |
| 5,490,266 | 2/1996 | Sturges | 395/500 |
| 5,490,268 | 2/1996 | Matsunaga | 395/550 |
| 5,491,640 | 2/1996 | Sharma et al. | 364/488 |
| 5,493,508 | 2/1996 | Dangelo et al. | 364/489 |
| 5,544,066 | 8/1996 | Rostoker et al. | 364/489 |
| 5,557,531 | 9/1996 | Rostoker et al. | 364/489 |
| 5,623,418 | 4/1997 | Rostoker et al. | 364/489 |
| 5,649,165 | 7/1997 | Jain et al. | 395/500 |
| 5,801,958 | 9/1998 | Dangelo | 364/489 |
| 5,805,861 | 9/1998 | Gilbert et al. | 395/500 |
| 7,757,657 | 5/1998 | Hathaway | 364/491 |

OTHER PUBLICATIONS

Tufte, "CML III Bipolar Standard Cell Library", Proceedings of the 1988 Bipolar Circuits and Technology Meeting, Minneapolis, Minnesota, Sep., 1988, pp. 180–182.

*Primary Examiner*—Kevin J. Teska
*Assistant Examiner*—Thuan Do
*Attorney, Agent, or Firm*—Charles A. Johnson; Mark T. Starr; Nawrocki, Rooney & Sivertson, P.A.

[57] ABSTRACT

A method and apparatus for incrementally optimizing a circuit design. The present invention provides an iterative EDA process that only requires the optimization, placement and routing of the actual changes made during a each design iteration, and leaves the remainder of the circuit design in a fixed state.

31 Claims, 16 Drawing Sheets

A = (OROF(ANDOF(OROF B,C)
(OROF D,E))
(ANDOF(OROF F,G)
(OROF H,J)))

ILLUSTRATIVE OPTIMIZATION CONTROL SPREADSHEET

| MODULE NAME | COMPILE_TYPE |
|---|---|
| MODULE-A | DONT-TOUCH |
| MODULE-B | FULL |
| MODULE-C | AREA |
| MODULE-D | RULES |
| MODULE-E | TIMING |
| MODULE-F | DONT-TOUCH |
| MODULE-G | RULES |

FIG. 10A

ILLUSTRATIVE OPTIMIZATION CONTROL MENU

| MODULE NAME | COMPILE_TYPE | | | | |
|---|---|---|---|---|---|
| | DT | FU | AR | RU | TI |
| MODULE-A | ☒ | ☐ | ☐ | ☐ | ☐ |
| MODULE-B | ☐ | ☒ | ☐ | ☐ | ☐ |
| MODULE-C | ☐ | ☐ | ☒ | ☐ | ☐ |
| MODULE-D | ☐ | ☐ | ☐ | ☒ | ☐ |
| MODULE-E | ☐ | ☐ | ☐ | ☐ | ☒ |
| MODULE-F | ☒ | ☐ | ☐ | ☐ | ☐ |
| MODULE-G | ☐ | ☐ | ☐ | ☒ | ☐ |

FIG. 10B

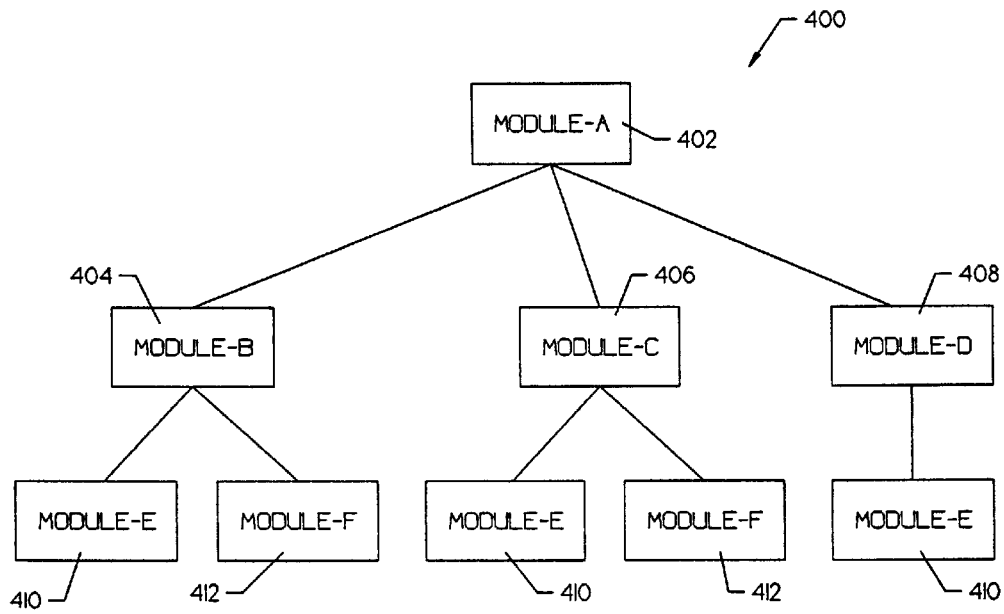

FIG. 11A

430 — ILLUSTRATIVE DESIGN HIERARCHY

MODULE-A
    MODULE-B
        MODULE-E
        MODULE-F
    MODULE-C
        MODULE-E
        MODULE-F
    MODULE-D
        MODULE-E

440 — ILLUSTRATIVE DIRECTORY STRUCTURE

/USER/PROJECT/MODULES
    MODULE-A
        -INCLUDES LINKS TO:
          /USER/PROJECT/MODULES/MODULE-B
          /USER/PROJECT/MODULES/MODULE-C
          /USER/PROJECT/MODULES/MODULE-D
    MODULE-B
        -INCLUDES LINKS TO:
          /USER/PROJECT/MODULES/MODULE-E
          /USER/PROJECT/MODULES/MODULE-F
    MODULE-C
        -INCLUDES LINKS TO:
          /USER/PROJECT/MODULES/MODULE-E
          /USER/PROJECT/MODULES/MODULE-F
    MODULE-D
        -INCLUDES LINKS TO:
          /USER/PROJECT/MODULES/MODULE-E
    MODULE-E
    MODULE-F

FIG. 11B

METHOD AND APPARATUS FOR INCREMNTALLY OPTIMIZING A CIRCUIT DESIGN

CROSS REFERENCE TO CO-PENDING APPLICATIONS

The present application is related to U.S. patent application Ser. No. 08/524.017, filed Aug. 29, 1995, entitled "A Method of Stabilizing Component and Net Names of Integrated Circuits In Electronic Design Automation Systems", and U.S. patent application Ser. No. 08/752,619, filed Nov. 19, 1996, entitled "Method and Apparatus For Providing Optimization Parameters to a Logic Optimizer Tool", both assigned to the assignee of the present invention, and both incorporated herein by reference.

BACKGROUND OF THE INVENTION

1. Field of the Invention

This invention relates generally to electronic design automation (EDA) systems used for designing integrated circuits. The invention is more specifically related to a method for incrementally optimizing a circuit design using EDA synthesis and logic optimizing tools during the integrated circuit design process.

2. Description of the Prior Art

The design process for all integrated circuits is composed of several discrete operations. Initially, the proposed functionality for a circuit is analyzed by one or more chip designers. These designers define the logical components of the circuit and their interactions by specifying the logic design using design capture tools. These design capture tools are commonly implemented in software executing on an engineering workstation, with well-known input devices being used to receive design information from the chip designer, and output devices, such as computer displays, being used to provide visual feedback of the design to the designer as it is being constructed. Such software is typically implemented as part of an electronic design automation (EDA) system. Specifically, the design entry operation involves generating a description of the logic design to be implemented on the circuit chip in an appropriate machine-readable form. Chip designers generally employ hierarchial design techniques to determine the appropriate selection and interconnection of logic and/or memory devices which will enable the chip to perform the desired function. These techniques involve describing the chip's functionality at various levels of abstraction, ranging from the most general function performed by the chip to the precise functions performed by each logic and/or memory element on the chip.

A common method for specifying the integrated circuit design is the use of hardware description languages. This method allows a circuit designer to specify the circuit at the register transfer level (also known as a "behavior description"). Using this method, the circuit is defined in small building blocks. The names of the building blocks are specified by the circuit designer. Thus, they usually are logical names with specific functional meaning.

Encoding the design in a hardware description language (HDL) is a major design entry technique used to specify modern integrated circuits. Hardware description languages are specifically developed to aid a designer in describing a circuit. These languages often contain specific functions and syntax to allow complex hardware structures to be described in a compact and efficient way.

It is useful to distinguish between those components of an integrated circuit design called cells, provided by a silicon chip vendor as primitive cells (i.e., leaf candidates), and the user-defined hierarchy blocks built upon them. One way is to speak of a "cell library" vs. a "design library" as two separate libraries, both of which are available to subsequent designs. Alternatively, at least initially, a design library contains a cell library. A cell library is a database containing detailed specifications on the characteristics of each logical component available for use in a design. Initial cell library contents are usually provided by the chip vendor. The components in the cell library are identified by the generic description of the component type. For example, the term "NAND" for a NAND gate is its type description and distinguishes this component from others such as OR gates, flip-flops, multiplexors, and so on. A two-input NAND gate might be of type 2NAND. When a 2NAND component is specified as part of a given circuit design, it is given an instance name, to distinguish it from all other 2NAND gates used in the circuit. The instance name typically includes the instance names of all parent instances by concatenation when defining the instance in the context of the chip.

A single name is sufficient when dealing only in the context of a single user function. The user-defined blocks can then be used to design larger blocks of greater complexity. The user-defined blocks are added to the design library, which grows from the additions of new design modules as the design evolves. The top level of the design hierarchy may be a single block that defines the entire design, and the bottom layer of the hierarchy may consist of leaf cells, the cells (i.e., the logical components) that were originally provided in the cell library. The resulting design is often called a detailed (or gate-level) description of the logic design.

The generation of the detailed description is often accomplished by logic design synthesis software for HDL entry. The logic design synthesis software generates a gate-level description of user-defined input and output logic, and also creates new gate-level logic to implement user-defined logical functions. Constituent parts of new gate-level logic created during each pass through the logic design synthesis software are given computer-generated component and net names. Each time the logic design synthesis software is executed for the integrated circuit design, the component and net names which are generated by the software, and not explicitly defined by the user, may change, depending on whether new logic has been added to or deleted from the integrated circuit design. Typically, the logic design synthesis software is executed many times during the integrated circuit design process, because errors may be detected during the simulation and testing phases of the design cycle and then fixed in the behavioral description, or because the design is incomplete, etc.

The output of the design capture and synthesis tools is a logic design database which completely specifies the logical and functional relationships among the components of the design. Once the design has been converted into this form, it may be optimized by sending the logic design database to a logic optimizer tool implemented in software. The logic optimizer may remove logic from the design that is redundant or unnecessary. As discussed above, this action affects the component and net names generated by the logic synthesis tool.

It is also necessary to verify that the logic definition is correct and that the integrated circuit implements the function expected by the circuit designer and meets predetermined performance goals (e.g. timing). This verification is currently achieved by estimated timing and simulation software tools. The design undergoes design verification analysis in order to detect flaws in the design. The design is also analyzed by simulating the device resulting from the design to assess the functionality of the design. If errors are found or the resulting functionality is unacceptable, the designer modifies the behavior description as needed. These design iterations help to ensure that the design satisfies its requirements.

As a result of each design revision, the logic design synthesis-generated component and net names may completely change. Further, the precise changes made by the logic optimizer may not be known without a detailed analysis of the database. Thus, the EDA tools downstream in the design process must typically be re-executed on the entire design, and not just on the portions of the design that contained the change.

After timing verifications and functional simulation has been completed on the design, placement and routing of the design's components is performed. These steps involve allocating components of the design to locations on the integrated circuit chip and interconnecting the components to form nets. Finally, final timing verification is performed after placement and routing is complete.

A major problem that arises during the above design process is that the changes made by the logic optimizer during each design iteration may not be precisely known. Further, the complex gate-level names generated by the logic design synthesis software may change during each iteration of the design process because of modifications to the integrated circuit design. Even a minimal change at critical points in the integrated circuit design may cause the logic design synthesis tools to change a substantial amount of the circuit design, and may generate completely new names for substantially all of the design. As a result, other EDA tools such as the logic optimizing, placement and routing tools must be re-executed on the entire design, rather than on only the portions or modules of the design that have been changed. Since many of the steps in the design process are iterative, such small changes in the behavior description of the design, usually made as a result of finding errors during timing verification and simulation, may cause large amounts of processing time to be used for re-executing the optimizing, placement, and routing tools on the entire design. Designers may iterate literally hundreds of times through the design and test cycle. One skilled in the art can readily see that this situation causes a substantial increase in the time needed for integrated circuits to be designed and tested. For current integrated circuit designs having hundreds of thousands of gates, this situation is unacceptable.

An EDA process that also minimizes the number of iterations needed to arrive at an acceptable design solution would be a valuable advance in the state of the art. The desired method would allow a circuit designer to converge on an acceptable design solution in fewer iterations of the design cycle than under previous methods. As indicated above, existing methods operate on an entire circuit design, thereby resulting in placement modifications and changes in timing characteristics. In extreme cases, the circuit designer may go through many design iterations, fixing new design problems arising from each iteration without converging on an acceptable solution. A better approach would be to ensure that only those portions of the circuit design that have changed in the current design iteration are revisited by the logic optimization, placement, routing, and timing analysis tools. This approach would leave acceptable portions of the circuit design in a fixed state, thus allowing the designer to concentrate on finalizing the design for the remaining portions of the integrated circuit design.

SUMMARY OF THE INVENTION

The present invention overcomes many of the disadvantages of the prior art by providing a method and apparatus for incrementally optimizing a circuit design. That is, the present invention provides an iterative EDA process that only requires the optimization, placement and routing of the actual changes made during each design iteration, and leaves the remainder of the circuit design in a fixed state. This may substantially decrease the time required to perform each design iteration, and may reduce the number of iterations needed to arrive at an acceptable design solution.

An exemplary method of the present invention includes the steps of: determining the incremental changes between a current circuit design database and a previous circuit design database; merging select design component changes and selected portions of the previous optimized circuit design, thereby resulting in a partially optimized circuit design; and selectively optimizing at least a portion of the partially optimized circuit design, including selected ones of the number of incremental changes.

In a preferred embodiment, the determining step may identify portions of the current circuit design that have not changed from the previous circuit design. This may be accomplished in a number of ways including using a revision control system, or a cone-graph compare algorithm as disclosed in U.S. patent application Ser. No. 08/524,017, filed Aug. 29, 1995, entitled "A Method of Stabilizing Component and Net Names of Integrated Circuits In Electronic Design Automation Systems", which has been incorporated herein by reference. In either case, the identified portions may be stored for later reference. Similarly, it is contemplated that the determining step may identify portions of the current circuit design that have changed from the previous circuit design.

Selected portions of the current circuit design may then be merged with portions of the previous fully optimized circuit design. That is, selected ones of the number of incremental changes identified by the determining means may be merged with the previous fully optimized circuit design, thereby resulting in a partially optimized circuit design.

Selected portions of the partially optimized database may then be optimized using a circuit optimization program. The portions of the current circuit design that have not changed from the previous circuit design, and identified by the above-referenced determining step, may be left unchanged. This may be accomplished by notifying the logic optimization program of the circuit portions that are not to be optimized during the current design iteration. Similarly, it is contemplated that the determining step may determine which portions of the current circuit design have changed, and may notify the logic optimization program of the circuit portions that have changed.

A user may identify additional circuit portions that are not to be optimized. This may be particularly useful in identifying circuit blocks that have been manually optimized or otherwise specially designed. Further, it is contemplated that the user may specify the optimization methodology to be used by the optimization program for predetermined circuit portions. For example, the user may specify whether particular circuit portions are to be optimized for power, speed, area, or some other predefined parameter. In a preferred embodiment, the above-referenced user specified information may be provided to the optimization program via a menu, spreadsheet or other input means.

Finally, it is contemplated that the present invention may be implemented in either hardware, software or a combination thereof.

BRIEF DESCRIPTION OF THE DRAWINGS

Other objects of the present invention and many of the attendant advantages of the present invention will be readily appreciated as the same becomes better understood by reference to the following detailed description when considered in connection with the accompanying drawings, in which like reference numerals designate like parts throughout the figures thereof and wherein:

FIG. 10A is a table showing an illustrative optimization control spreadsheet;

FIG. 10B is a table showing an illustrative optimization control menu;

FIG. 11A is tree graph showing the design hierarchy of a typical circuit design database;

FIG. 11B is a table showing the design hierarchy of the database shown in FIG. 11A, and an illustrative directory structure for storing each of the modules within the design hierarchy;

DETAILED DESCRIPTION OF THE PREFERRED EMBODIMENTS

Figure 1:
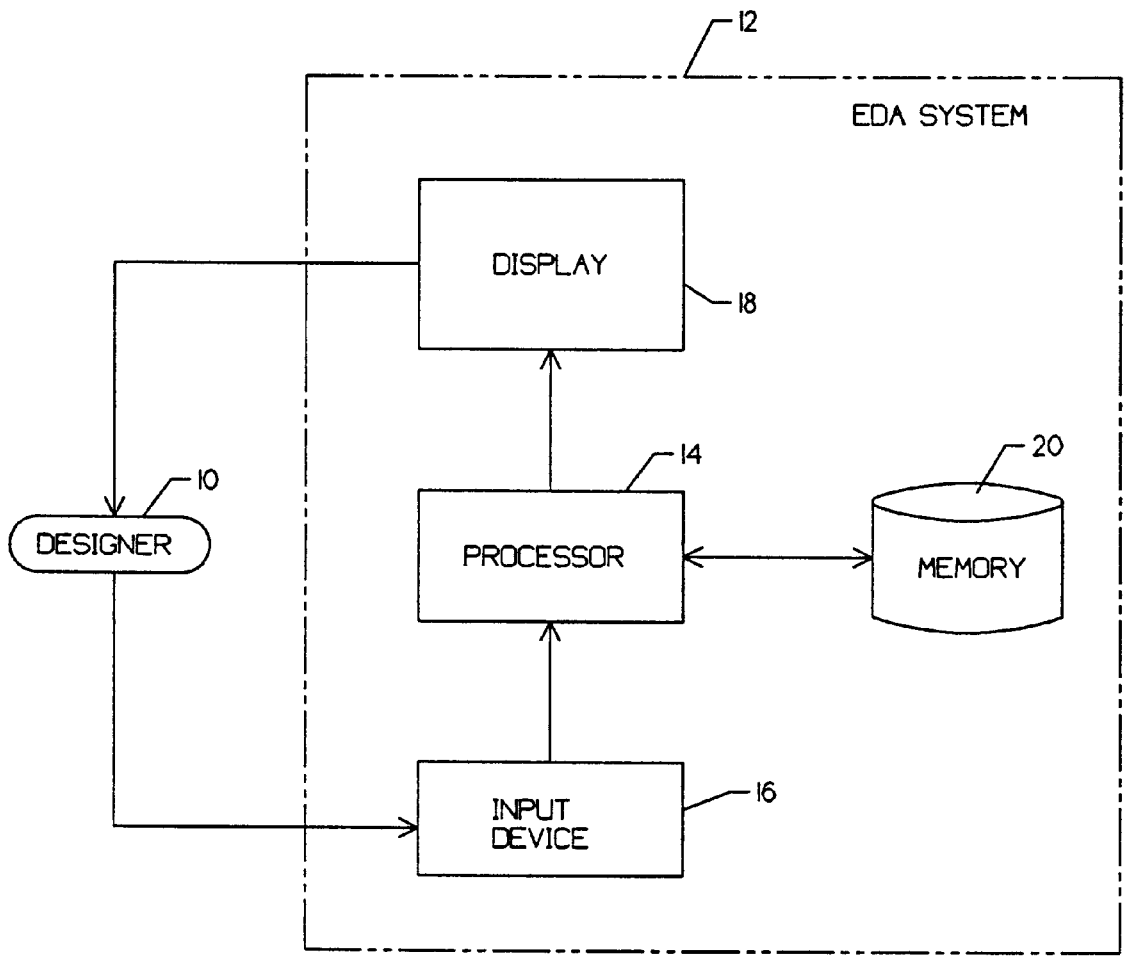
FIG. 1 is a block diagram of the computer-based environment of the present invention.

The detailed descriptions which follow are presented largely in terms of algorithms and symbolic representations of operations on data bits within a computer memory. These algorithmic descriptions and representations are the means used by those skilled in the data processing arts to most effectively convey the substance of their work to others skilled in the art.

An algorithm is here, generally, conceived to be a self-consistent sequence of steps leading to a desired result. These steps are those requiring physical manipulations of physical quantities. Usually, though not necessarily, these quantities take the form of electrical or magnetic signals capable of being stored, transferred, combined, compared, and otherwise manipulated. It proves convenient at times, principally for reasons of common usage, to refer to these signals as bits, values, elements, symbols, characters, terms, numbers or the like. It should be kept in mind, however, that all of these and similar terms are to be associated with the appropriate physical quantities and are merely convenient labels applied to these quantities.

Furthermore, the manipulations performed are often referred to in terms, such as adding or comparing, which are commonly associated with mental operations performed by a human operator. No such capability of a human operator is necessary, or desirable in most cases, in any of the operations described herein which form part of the present invention; the operations are machine operations. Useful machines for performing the operations of the present invention include general purpose digital computers or other similar devices. In all cases, it should be kept in mind the distinction between the method operations in operating a computer and the method of computation itself. The present invention relates to method steps for operating a computer in processing electrical or other (e.g., mechanical, chemical) physical signals to generate other desired physical signals.

The present invention also relates to apparatus for performing these operations. This apparatus may be specially constructed for the required purposes or it may comprise a general purpose computer as selectively activated or reconfigured by a computer program stored in the computer. The algorithms presented herein are not inherently related to a particular computer system or other apparatus. In particular, various general purpose computer systems may be used with computer programs written in accordance with the teachings of the present invention, or it may prove more convenient to construct more specialized apparatus, to perform the required method steps. The required structure for such machines will be apparent from the description given below.

In sum, the present invention preferably is implemented for practice by a computer, e.g., a source code expression of the present invention is input to the computer to control operations therein. It is contemplated that a number of source code expressions, in one of many computer languages, could be utilized to implement the present invention. A variety of computer systems can be used to practice the present invention, including, for example, a personal computer, an engineering work station, an enterprise server, etc. The present invention, however, is not limited to practice on any one particular computer system, and the selection of a particular computer system can be made for many reasons.

FIG. 1 is a block diagram of the computer-based environment of the present invention. A Designer 10 interacts with an Electronic Design Automation (EDA) System 12 to enter an integrated circuit design, validate the design, place the design's components on a chip, and route the interconnections among the components. The integrated circuit may be an application specific integrated circuit (ASIC). The EDA System 12 includes a Processor 14, which executes operating system software as well as application programs known as EDA software. The Processor is found in all general purpose computers and almost all special purpose computers. The EDA System 12 is intended to be representative of a category of data processors suitable for supporting EDA operations. In the preferred embodiment, the EDA System is a HP A1097C Series 700 engineering workstation, commercially available from Hewlett-Packard Corporation, although other engineering workstations or computer systems from manufacturers such as Sun Microsystems, Inc. may also be used.

The Designer 10 enters design information into the EDA System by using a well-known Input Device 16 such as a mouse, keyboard, or a combination of the two devices. It should be understood, however, that the Input Device may actually consist of a card reader, magnetic or paper tape reader, or other well-known input device (including another computer system). A mouse or other cursor control device is typically used as an Input Device as a convenient means to input information to the EDA System to select command modes, edit input data, and the like. Visual feedback of the design process is given to the Designer by showing the design being constructed as graphical symbols on Display 18. The Display is used to display messages and symbols to the Designer. Such a Display 18 may take the form of any of several well-known varieties of CRT displays. The EDA software being executed by the Processor 14 stores information relating to logic design in Memory 20. The Memory may take the form of a semiconductor memory, magnetic disks, optical disks, magnetic tape or other mass storage device.

Figure 2:
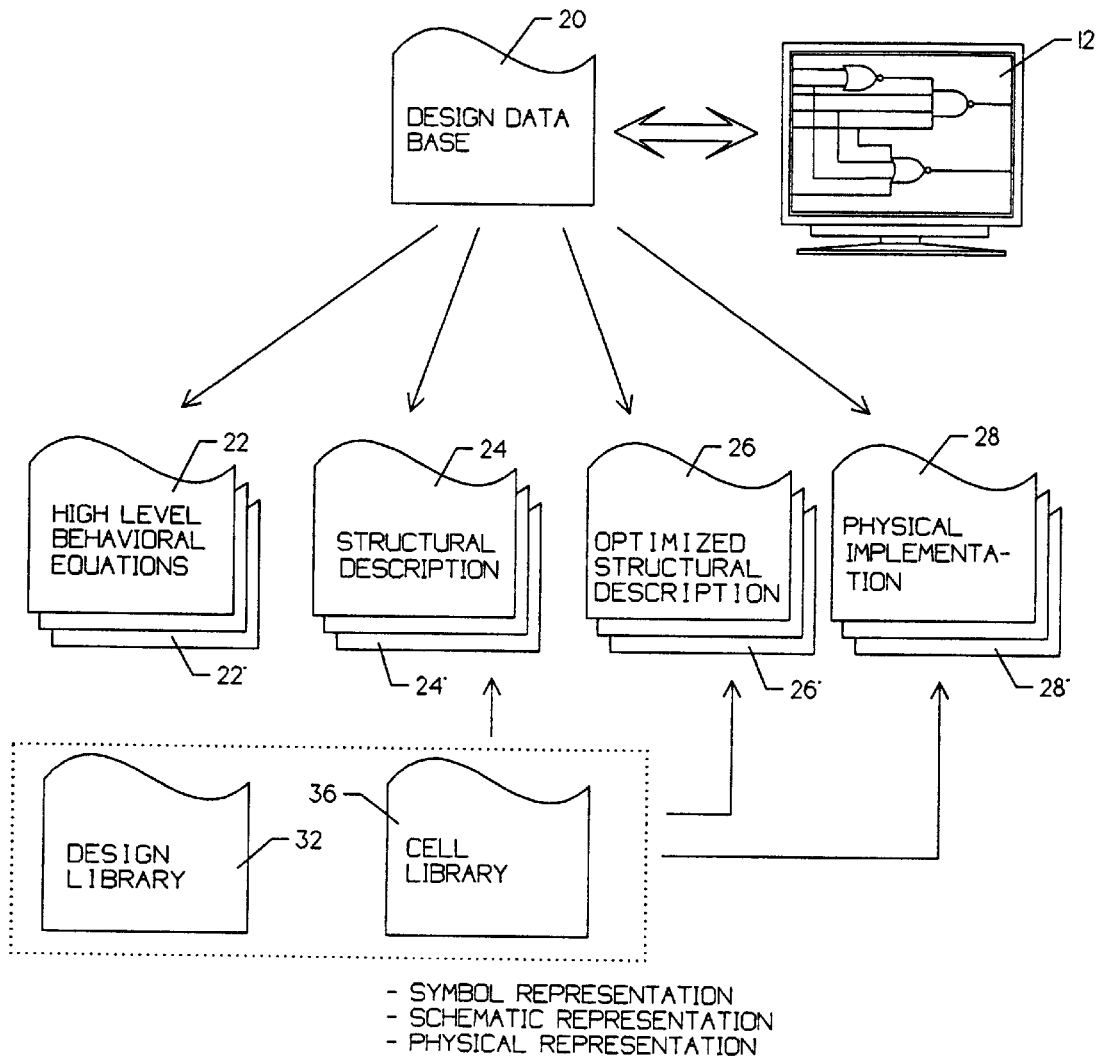
FIG. 2 is a block diagram showing typical circuit representations stored within a circuit design database.

FIG. 2 is a block diagram showing a number of circuit representations stored within a typical circuit design database. The design database 20 may include a high level behavioral representation 22, a structural description representation 24, an optimized structural representation 26, and a physical representation 28. Further, the database may include previous revisions of the high level behavioral representation 22', a structural description representation 24', an optimized structural representation 26', and a physical representation 28'.

As indicated above, the circuit designer typically specifies the logic design of an integrated circuit by using design capture software that runs on an EDA system 12. In the preferred embodiment, the Hardware Computer-Aided Design System (HCADS), available from Unisys Corporation, is used as Design Capture software, although other design capture programs from companies such as Cadence Design Systems, Inc., Synopsys, Inc., and Mentor Graphics, Inc., are also commercially available. At a minimum, when using a hardware description language, any text editor program may be used to specify the design. The result of this activity is a high level behavior description representation 22, which typically represents the logic design as specified at the register transfer level. Items in the high level behavior description representation 22 may map to functional components of the design. In the preferred embodiment, the high level behavior description representation 22 is written in a design language called Universal Design Source Language (UDSL), although other existing, well-known hardware design languages could also be used.

Figure 9:
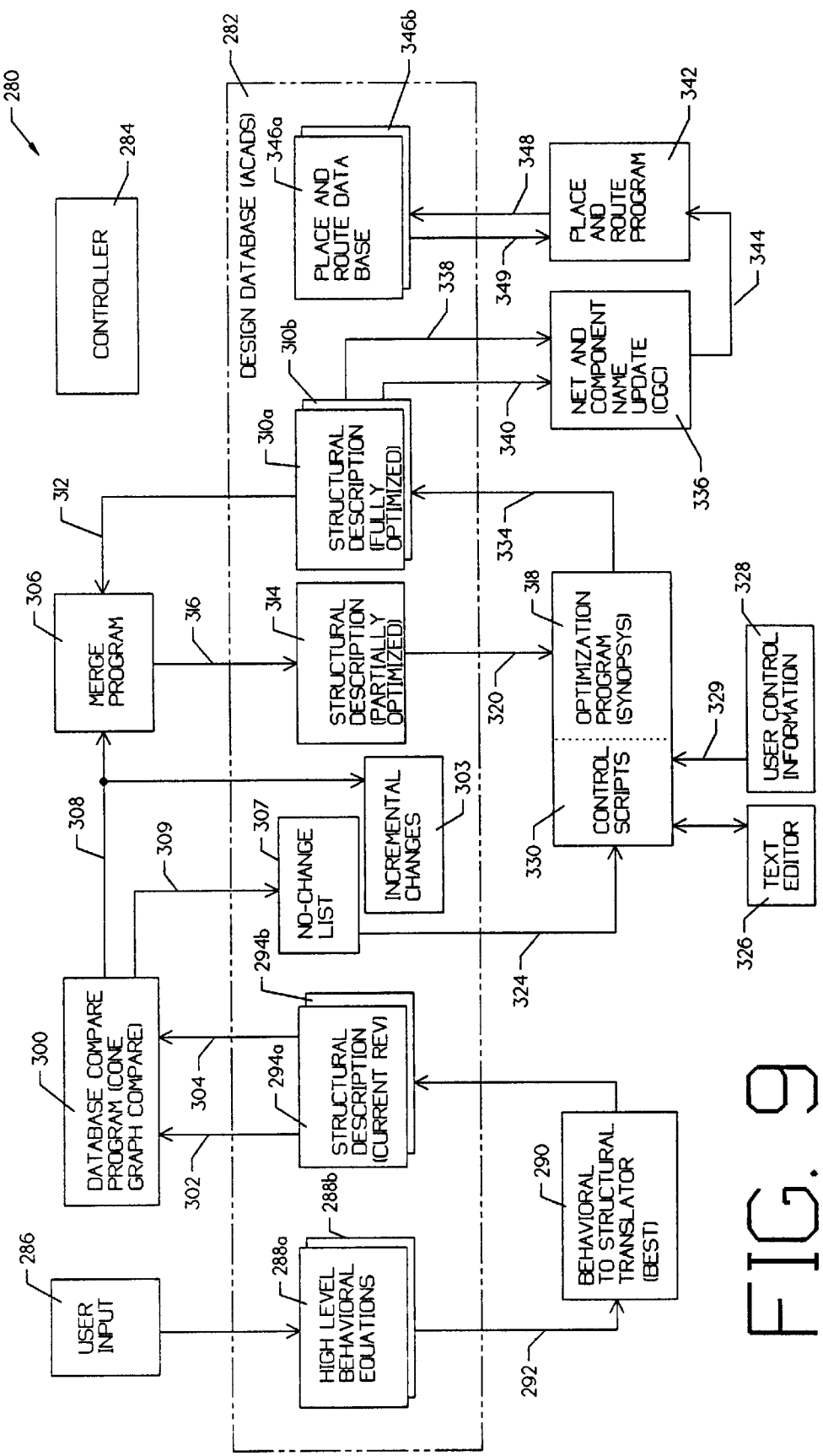
FIG. 9 is a schematic diagram showing an exemplary data processing system in accordance with the present invention.

The high level behavior description representation 22 may be input to a logic design synthesis tool (see for example, FIG. 9). The logic design synthesis tool may assign the gates and other circuitry needed to implement the functions specified by the high level behavior description representation 22. In the preferred embodiment, the synthesis software is the Behavior to Structure Translator (BEST) synthesis tool developed by Unisys Corporation. However, alternate embodiments such as the VHDL Design Compiler commercially available from Synopsys, Inc., the DesignBook Synthesis tool from Escalade, and the Synergy synthesis tool available from Cadence Design Systems, Inc. may also be used.

The Logic Design Synthesis tool may output a structural description representation 24, which is sometimes referred to as the netlist for the design. This file contains the gate-level definition of the logic design. The structural description representation 24 may be in the Prime Behavior Description Language ('BDL), a format developed and used by the Unisys Corporation.

The structural description representation 24 may be provided to other EDA software programs, including an optimization program. The circuit optimization program may read the structural description representation 24 and optimize the logic represented therein. Typically, the optimization tool may read and write Electronic Data Interchange Format (EDIF) files. The EDIF format is an industry standard format for hardware design language information. Thus, embedded within a typical optimization program is an EDIF reader and an EDIF writer. The EDIF writer and reader translate the circuit design database 20 from an internal format to and from the EDIF format.

The optimization methodology used by the optimization program may be selectable by the user. For example, the user may direct the optimization tool to optimize a particular portion of the circuit design such that power, area, speed or other predefined parameters are optimized.

The optimization program may optimize the structural description representation 24 using components from a selected cell library 30 or design library 32. The optimization program may provide an optimized structural description representation, as shown at 26. In the preferred embodiment, the optimization program is the Design Compiler, commercially available from Synopsys, Inc.

The optimized structural description representation 26 may then be placed and routed using a commercially available place and route tool. In the preferred embodiment, the place and route tool is provided by Cadence Design Systems, Inc. is utilized, although other firms active in the electronic design automation (EDA) industry all sell systems similar in function to the above-mentioned Cadence tool.

Figure 3:
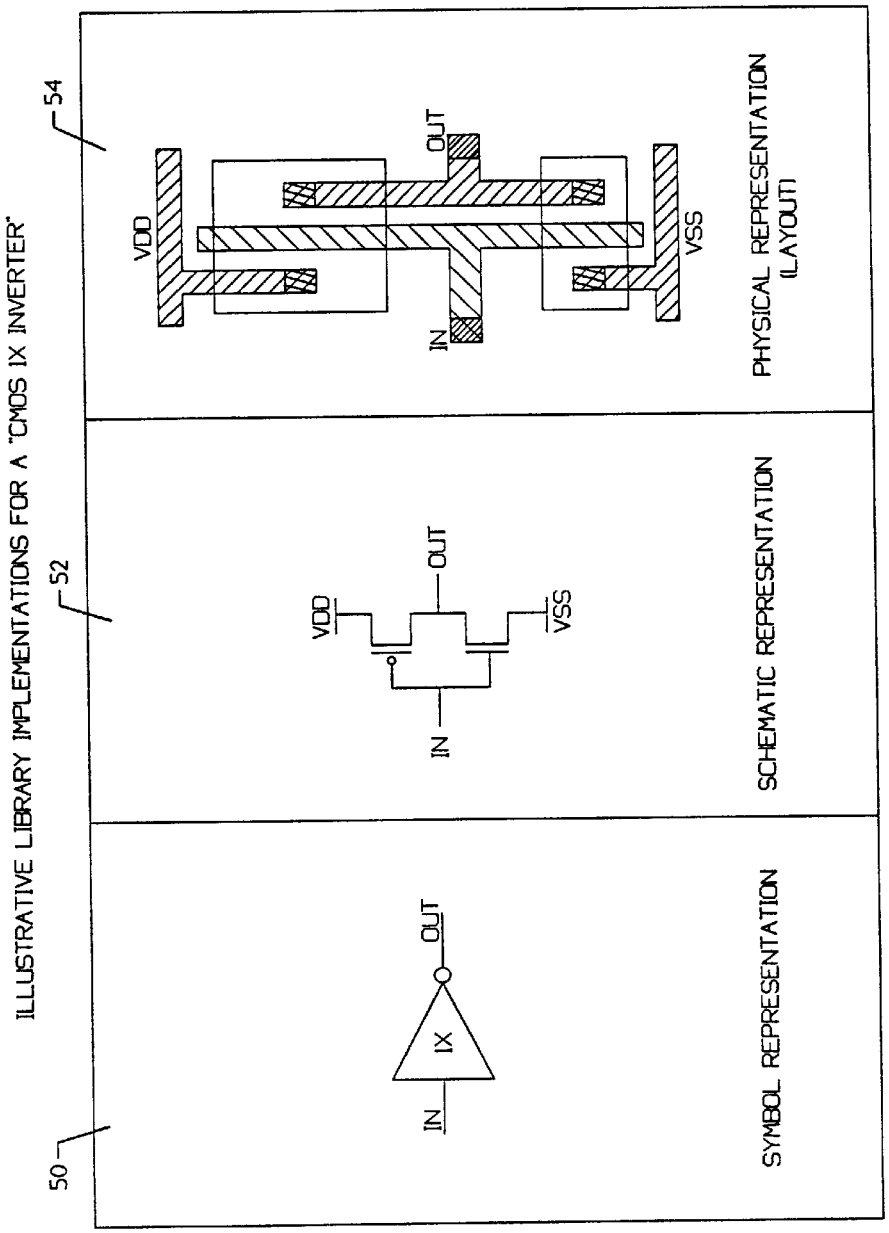
FIG. 3 illustrates,a symbolic, schematic and layout representation of a typical library component.

The result may be stored in the circuit design database 20 as a physical implementation representation 28. As shown in FIGS. 2–3, typical cell libraries include a number of representation of each component therein including a symbol representation, a schematic representation and a physical representation. This may also be true for selected components in the design library 32. The physical implementation representation 28 of the circuit design database 20 typically includes references to the physical representation of the library components referenced therein.

FIG. 3 illustrates a symbolic, schematic and layout representation of a typical library component. The library component used for illustration purposes is a "CMOS 1X INVERTER". In a typical cell library, each component has a symbol representation 50, a schematic representation 52 and a physical representation 54. It is recognized, however, that more representations for each cell component may be provided.

Figures 4A, 4B:
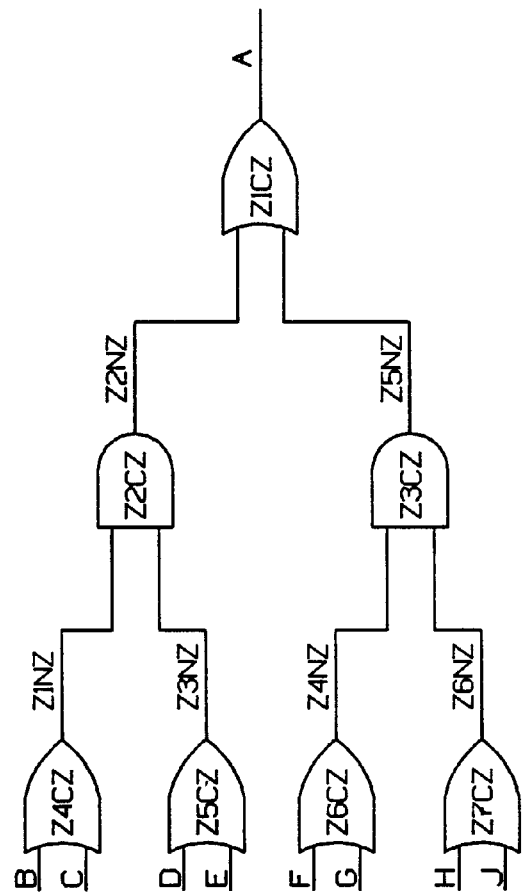
FIG. 4A illustrates a behavioral equation representation of selected logic from a circuit design.
FIG. 4B is a structural level description synthesized from the behavioral equation shown in FIG. 4A.

FIG. 4A illustrates a behavioral equation representation of selected logic of a circuit design. In this simple example, the signal named "A" is generated by a combination of "AND" and "OR" logical functions. The input signals are provided by "B", "C", "D", "E", "F", "G", "H", and "J". This behavior description is then input to a logic design synthesis tool to produce a gate-level description. FIG. 4B is a gate-level representation synthesized from the behavior description shown in FIG. 4A. The user-defined names "A", "B", "C", "D", "E", "F", "G", "H", and "J" are shown as input and output lines for the circuit. The logic design synthesis tool has generated multiple "AND" and "OR" gates to implement the behavior description. These gates, and the interconnections between them, are given names by the logic design synthesis tool. In the example shown in FIG. 4B, all synthesis-generated names start with the letter "Z".

As discussed above, current logic design synthesis tools read a behavior description and transform that description into a structural description. During the transformation process, the majority of components and nets are automatically generated by the logic design synthesis software. During the component and net generation process, the logic design synthesis tool will assign a unique name to each synthesis-generated component and net (i.e., those components and nets not explicitly defined by the circuit designer). Generally, the circuit designer has the ability to specify some minimal set of names within the behavior description. A fundamental problem with synthesis tools is their inability to recognize design changes from one design version to another. Thus, for every pass that the synthesis process is activated, a new unique name is generated for each component and net generated by the logic design synthesis tool. Further, the changes made by the synthesis tool are not precisely known without a detailed analysis of the resulting netlist.

Figure 5:
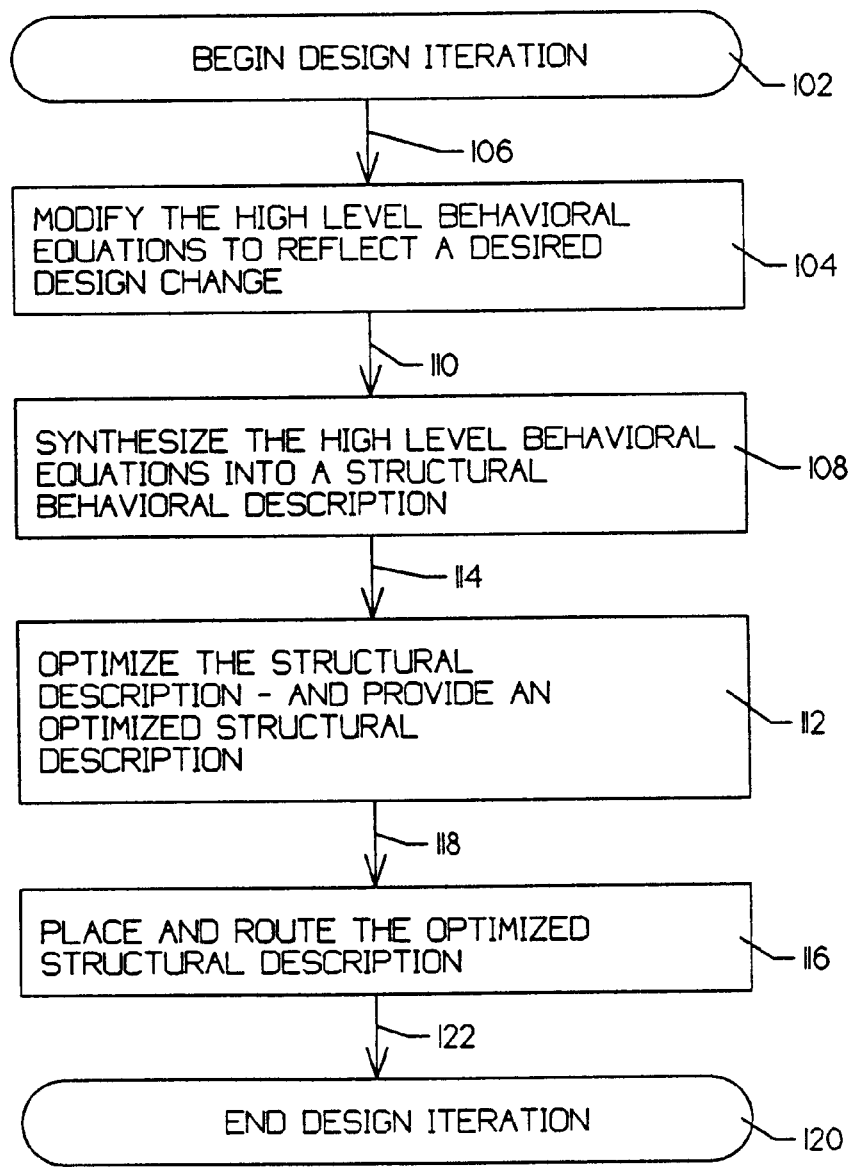
FIG. 5 is a flow diagram showing a typical prior art design iteration.

FIG. 5 is a flow diagram showing a typical prior art design iteration. As indicated above, integrated circuit designers typically describe the high-level logical representation of a design in terms of equations. This logical representation is called a "behavioral" description. The behavioral description is simulated and verified to assure that it conforms to the desired specifications. Once the behavioral description of the integrated circuit has been initially verified, it is transformed into a detailed description (also known as a structural or gate-level description). This conversion process is called synthesis. The detailed description represents the equation-based behavioral description in the form of gate-level objects (components) and the connections (nets) between the objects. The detailed description is used for the remaining design processes. For example, the detailed description is used to simulate the design at the gate level, establish the initial physical component placement (floor plan), complete the final physical component placement and net interconnect routing (layout), perform delay calculation and timing analysis, and generate test patterns for manufacturing verification.

An integrated circuit designer may make changes to the behavioral description for a variety of reasons. These changes often require steps in the design process to be performed again. However, the precise changes made by the logic optimizer may not be known without a detailed analysis of the database. Further, the logic design synthesis-generated component and net names may completely change. Thus, the EDA tools downstream in the design process must typically be re-executed on the entire design, and not just on the portions of the design that contained the change.

In accordance therewith, each design iteration is entered at element 102, wherein control is passed to element 104 via interface 106. Element 104 modifies the high level behavioral equations to reflect a desired design change. Control is then passed to element 108 via interface 110. Element 108 synthesizes the entire set of high level behavioral equations into a new structural description. Control is then passed to element 112 via interface 114. Element 112 optimizes the entire structural description, and provides an optimized structural description. Control is then passed to element 116 via interface 118. Element 116 places and routes the entire optimized structural description. Control is then passed to element 120 via interface 122, wherein the design iteration is exited.

Figure 6:
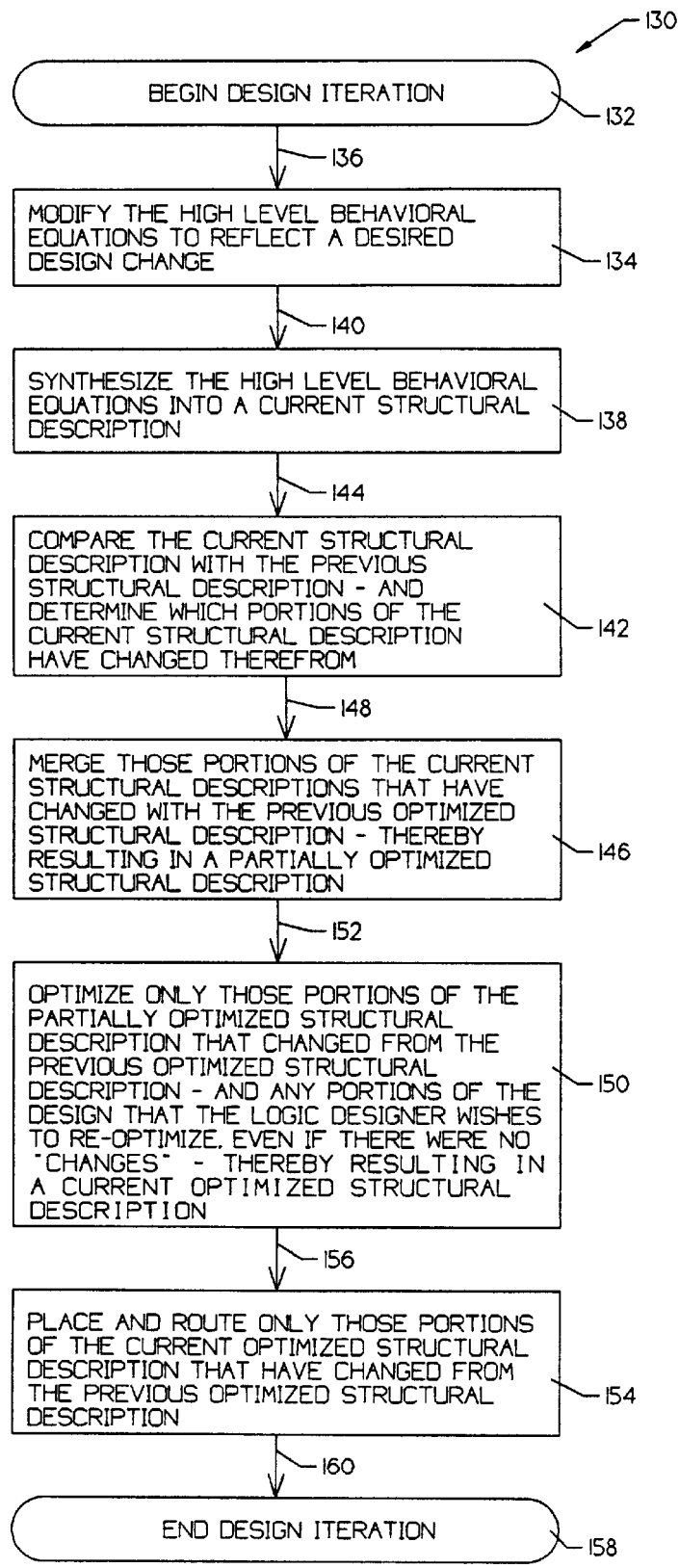
FIG. 6 is a flow diagram showing an exemplary design method of the present invention.

FIG. 6 is a flow diagram showing an exemplary design method of the present invention. The flow diagram is generally shown at 130. The design iteration is entered at element 132, wherein control is passed to element 134 via interface 136. Element 134 modifies the high level behavioral equations to reflect desired design change. This may be accomplished by a user using an electronic design automation system, as described above. Control is then passed to element 138 via interface 140. Element 138 synthesizes the high level behavioral equations into a current structural description. Control is then passed to element 142 via interface 144. Element 142 compares the current structural description with the previous structural description and determines which portions of the current structural description have changed therefrom. Control is then passed to element 146 via interface 148. Element 146 merges those portions of the current structural description that have changed, with the previous optimized structural description. The result is a partially optimized structural description. Control is then passed to element 150 via interface 152. Element 150 optimizes only those portions of the partially optimized structural description that have changed from the previous optimized structural description. Element 150 may also optimize those portions of the design that a circuit designer wished to re-optimize, even if there are no "changes", as described below.

The result is a current optimized structural description of the circuit design. Control is then passed to element 154 via interface 156. Element 154 places and routes only those portions of the current optimized structural description that have changed from the previous optimized structural description. Control is then passed to element 158 via interface 160, wherein the design iteration is exited.

Figure 7:
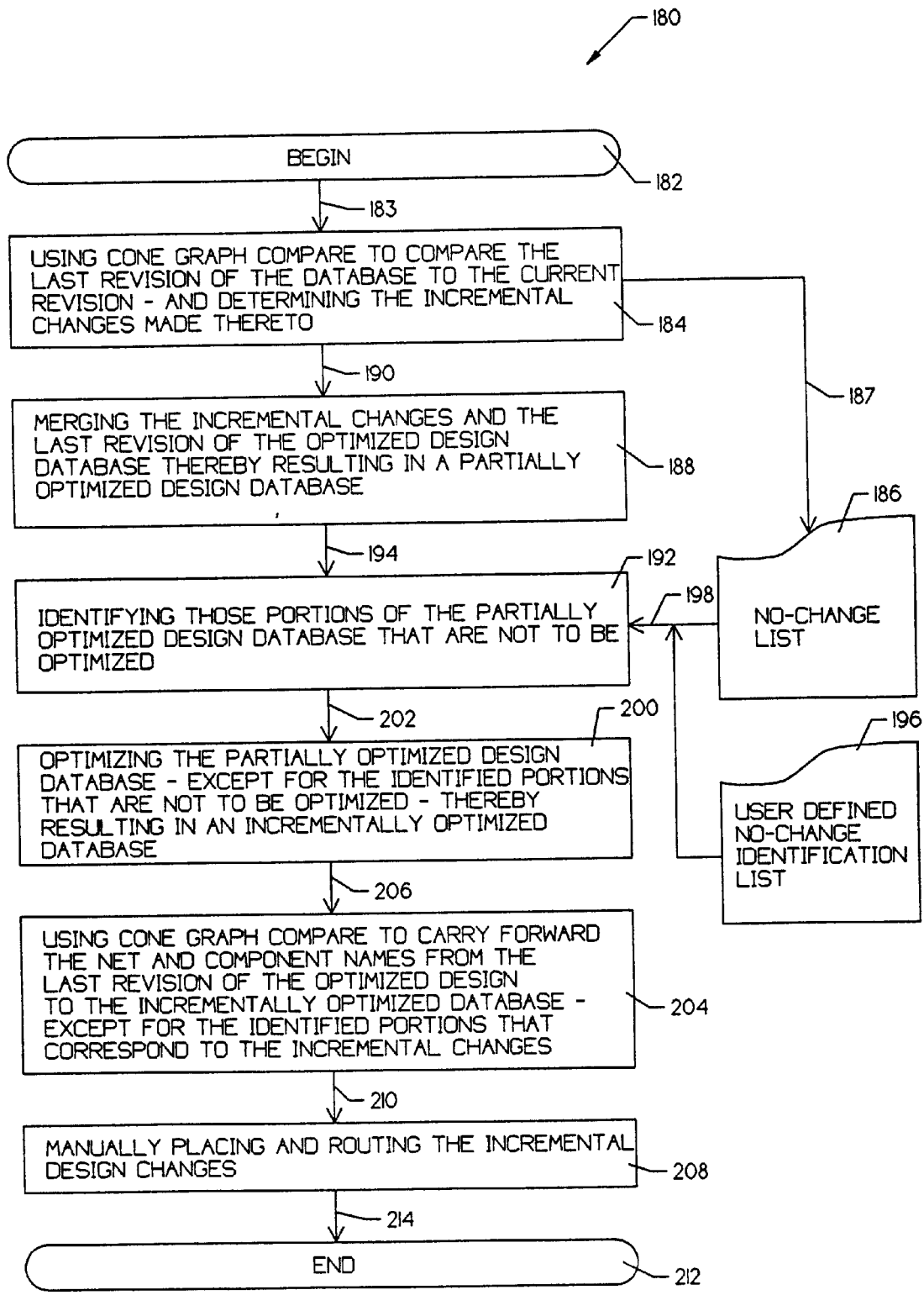
FIG. 7 is a flow diagram showing another exemplary design method of the present invention.

FIG. 7 is a flow diagram showing another exemplary design method of the present invention. The flow diagram is generally shown at 180. The design iteration is entered at element 182, wherein control is passed to element 184 via interface 183. Element 184 uses a cone graph compare program to compare the last revision of the database to the current revision, and to determine the incremental changes made therebetween. The cone graph compare program is disclosed in U.S. patent application Ser. No. 08/524,017, filed Aug. 29, 1995, entitled "A Method of Stabilizing Component and Net Names of Integrated Circuit is Electronic Design Automation Systems", which has been incorporated herein by reference. In an exemplary embodiment, the cone graph compare program provides a no-change list 186 via interface 187. The no-change list 186 identifies the circuit portions that have not changed in the current revision relative to the last revision of the circuit design database.

Control is then passed to element 188 via interface 190. Element 188 merges the incremental changes and the last revision of the optimized design database, thereby resulting in a partially optimized design database. Control is then passed to element 192 via interface 194. Element 192 identifies those portions of the partially optimized design database that are not to be optimized. To accomplish this, element 192 may read the no-change list 186 via interface

198. Further, element 192 may read a user defined no-change identification list 196 via interface 198. The user defined no-change identification list 196 is further discussed below, and in particular, with reference to FIG. 10A. Control is then passed to element 200 via interface 202. Element 200 optimizes the partially optimized design database, except for the identified portions that are not to be optimized. The result is an incrementally optimized database.

Control is then passed to element 204 via interface 206. Element 204 uses the cone graph compare program to carry forward the net and component names from the last revision of the optimized design database to the incrementally optimized design database. Control is then passed to element 208 via interface 210. Element 208 manually places and routes the incremental design changes. Control is then passed to element 212 via interface 214, wherein the design iteration is exited.

Figure 8:
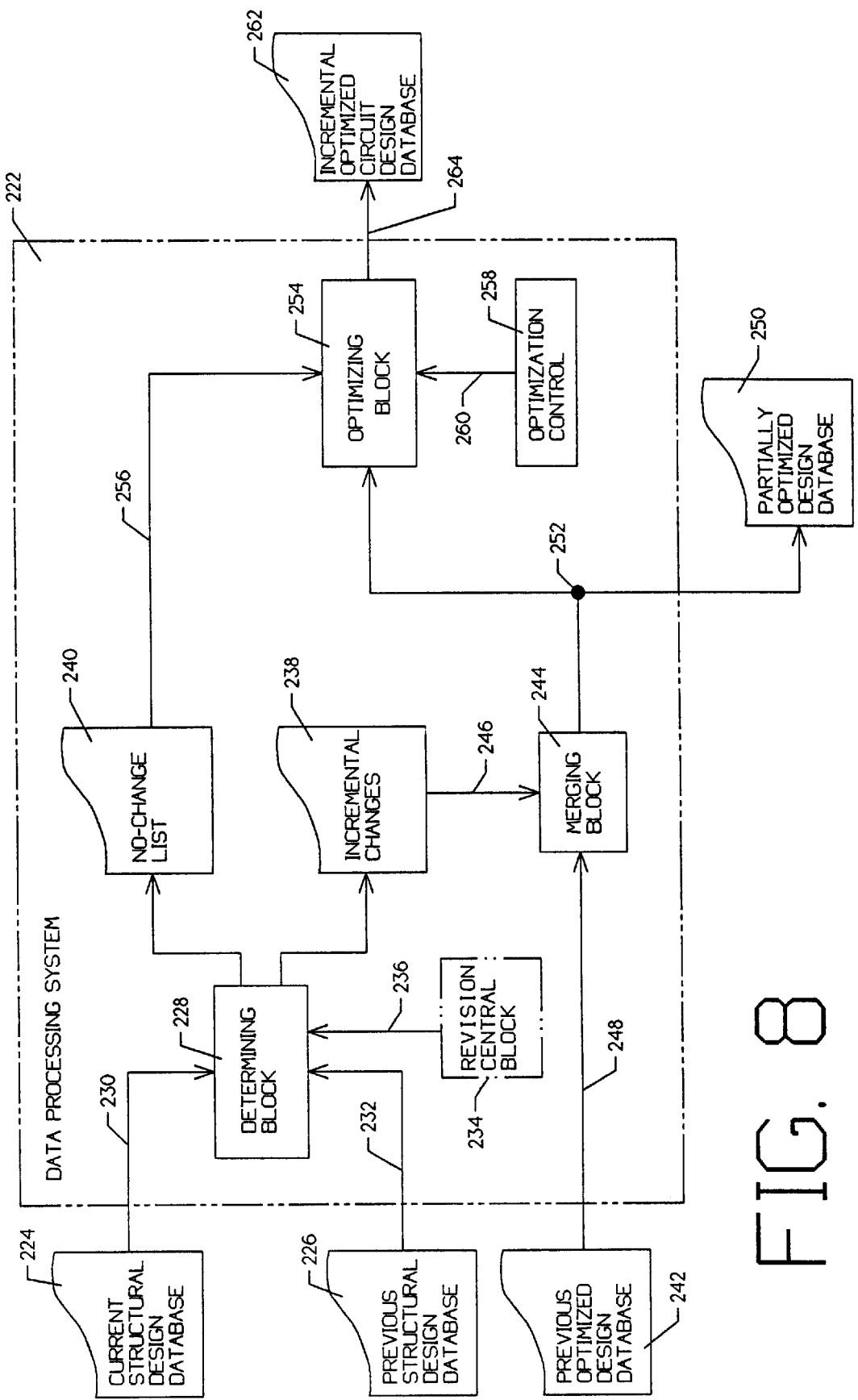
FIG. 8 is a schematic diagram of a data processing system that incorporates an exemplary embodiment of the present invention.

FIG. 8 is a schematic diagram of a data processing system that incorporates an exemplary embodiment of the present invention. The data processing system is generally shown at 222, and may include a determining block 228, a revision control block 234, a merging block 244, a optimizing block 254, and an optimization control block 258.

The data processing block 222 may either store or have access to a current structural design database 224, a previous structural design database 226, a previous optimized design database 242, a partially optimized design database 250, and an incremental optimized circuit design database 262. These portions of the design database are also discussed with reference to FIG. 2.

Determining block 228 may read the current structural design database 224 and the previous structural design database 226 via interfaces 230 and 232, respectively. Determining block 228 may then compare the current structural design database 224 with the previous structural design database 226, and determine the incremental changes therebetween. This may be accomplished in any number of ways, including using a cone graph compare algorithm as disclosed in U.S. patent application Ser. No. 08/524.017, filed Aug. 29, 1995, entitled "A Method of Stabilizing Component and Net Names of Integrated Circuits in Electronic Design Automation Systems". Alternatively, a revision control block 234 may be provided, wherein the revision control block 234 may notify the determining block 228 of all modules within the current structural design database 224 that have a different revision control identifier than the corresponding modules in the previous structural design database 226. This information may be provided to the determining block 228 via interface 236.

The determining block 228 may record, in an incremental changes file 238, which modules within the current structural design database 224 that have changed. Further, determining block 228 may record, in a no-change file 240, which modules within the current structural design database 224 that have not changed.

Merging block 244 may read the previous optimized design database 242 via interface 248, and may further read the recorded incremental changes file 238 via interface 236. Merging block 244 may merge selected ones of the number of incremental changes and selected portions of the previous optimized circuit design database, and may provide a partially optimized design database 250 via interface 252. In a preferred embodiment, merging block 244 may substitute the corresponding portions of the previously optimized design database 244 with the corresponding ones of the number of incremental changes 238.

The partially optimized design database 250 may then be provided to optimizing block 254 via interface 252. Optimizing block 254 may selectively optimize at least a portion of the partially optimized design database, including selected ones of the number of incremental changes. Optimizing block 254 may also read the no-change file 240 via interface 256, and may be controlled by an optimization control block 258 via interface 260. The no-change file 240 may notify the optimizing block 254 of all modules that have not changed from the previous structural design database 226 to the current structural design database 224. Thus, the optimizing block 254 need not optimize these portions of the partially optimized design database 250. Further, optimization control block 258 may identify user identified modules that should not be optimized by the optimization block 254, including manually optimized or otherwise specially designed modules within the partially optimized design database. In addition, optimization control block 258 may specify the methodology that should be used by the optimizing block 254 for specified modules within the design. For example, the user may specify, through the optimization control block 258, whether particular circuit portions are to be optimized for power, speed, area, or some other predefined parameter. It is contemplated that the above-referenced user specified information may be provided to the optimization control block 258 via a menu, spreadsheet, or other input means. Optimizing block 254 optimizes the selected portions of the partially optimized design database 250, and writes out an incrementally optimized circuit design database 262 via interface 264.

The user may also choose to re-optimize an unchanged design for a different "goal", for example power, speed, area, etc. In an exemplary embodiment, this may be accomplished by editing the no-change list 240. By editing or deleting an object from the no-change list, a re-optimization may be effected.

As can readily be seen, the present invention provides an iterative EDA process that only requires the optimization of the actual changes made during each design iteration, and leaves the remainder of the circuit design in a fixed state. This may substantially decrease the time required for each design iteration and may reduce the number of iterations needed to arrive at an acceptable design solution.

FIG. 9 is a schematic diagram showing an exemplary data processing system in accordance with the present invention. FIG. 9 further shows the interaction between the design database 282 and the various tools that may be used to implement the present invention. As indicated above, a user may provide a high level behavioral description of a desired circuit design via a user input block 286. In the preferred embodiment of the present invention, the Hardware Computer-Aided Design System (HCADS), available from Unisys Corporation, is used as the design capture software, although other design capture programs from companies such as Cadence Design Systems, Inc., Synopsis, Inc., and Mentor Graphics, Inc., are also commercially available. At a minimum, when using a hardware description language, any text editor program may be used to specify the design. The result of this activity is a high level behavioral description specified in equations as shown at 288$a$. As indicated with reference to FIG. 2, it is contemplated that the data processing system may also retain the previous high level behavioral description 288$b$ from a previous design iteration.

The high level behavioral equations 288$a$ may be provided to a logic synthesizer 290 via interface 292. In the preferred embodiment, the logic synthesizer comprises the Behavioral to Structure Translator "BEST" Synthesis Tool developed by Unisys Corporation. However, it is recognized that alternative logic synthesizers such as the Design Compiler commercially available from Synopsys, Inc., the DESIGN Book Synthesis Tool from Escalade, and the Synergy Synthesis Tool available from Cadence Design Systems, Inc. may also be used. The synthesis tool 290 may work in conjunction with a compiler (not shown) to generate the current revision of a structural description 294a. It is contemplated, that the data processing system 280 may retain the previous revision or revisions of the structural description as shown at 294b.

The current revision of the structural description and the previous revision of the structural description may be provided to a database compare program 300 via interface 302 and 304, respectively. The database compare program 300 may either be a revision control system, or a cone graph compare program as disclosed in U.S. patent application Ser. No. 08/524,017, filed Aug. 29, 1995, entitled "A Method of Stabilizing Component and Net Names of Integrated Circuits in Electronic Design Automation Systems". The database compare program 300 may record the portions of the current revision of the structural description 294a that have not changed from the previous revision of the structural description 294b in a no-change list 307 via interface 309. Further, the database compare program 300 may record the incremental changes between the current revision of the structural description and the previous revision of the structural description 294b in incremental changes block 303.

A merge program 306 may read the incremental changes provided by database compare program 300 via interface 308, and may further read the fully optimized structural description 310b of the previous revision. The merging program 306 may merge selected ones of the number of incremental changes and selected portions of the previous optimized structural description 310b of the previous iteration. This may be accomplished by simply substituting selected portions of the fully optimized structural description 310b from the previous iteration with corresponding ones of the number of incremental changes. In any event, the merging program 306 provides a partially optimized structural description 314 of the circuit design. The partially optimized structural description 314 is then provided to an optimization program 318 via interface 320.

The optimization program 318 selectively optimizes at least a portion of the partially optimized structural description 314. To determine which portions of the partially optimized structural description 314 to optimize, the optimizing program 318 may be controlled by a number of control scripts 330. The control scripts 330 may read the no-change list 307 via interface 324, and may further read user control information via interface 329. The control scripts 330 control the optimization program 318, such that only those portions of the design that have changed from the previous revision are optimized. That is, the no-change list 307 and user control information block 328 may indicate which modules within the partially optimized structural description 314 that have not changed from the previous design revision. In a preferred embodiment, the control scripts 330 may utilize a text editor 326 to process the necessary information. A further discussion of the operation of the control scripts 330 can be found below with reference to FIGS. 13–16. After optimization, a current revision of a fully optimized structural description 310a is provided via interface 334.

The previous revision of the fully optimized structural structure 310b and the current revision of the fully optimized structural description 310a are provided to net and component name update block 336 via interfaces 338 and 340, respectively. Net and component name update block 336 carries forward the net and component names from the previous revision of the fully optimized structural description 310b to the current revision of the fully optimized structural description 310a, for at least the portions that have not changed. In a preferred embodiment, this is accomplished using a cone graph compare program as disclosed in U.S. patent application Ser. No. 08/524,017, filed Aug. 29, 1995, entitled "A Method of Stabilizing Component and Net Names in Integrated Circuits in Electronic Design Automation Systems". The result is provided to a place and route program 342 via interface 344. The place and route program 342 may read the previous revision of the place and route database 346b via interface 349. Because the net and component names have been carried forward from the previous fully optimized structural description 310b, those portions of the previous revision of the placement route database that correspond to the unchanged portions of the current revision of the fully optimized structural description 310a may remain fixed. Thus, the only portions of the current revision of the fully optimized structural description 310a that need to be placed and routed are those portions that have changed from the previous revision. This can be done manually or automatically using place and route program 342. The place and route program 342 then provides a current revision of the place and route database 346a via interface 348. It is contemplated that the data processing system 280 may be controlled by controller 284 to accomplish the above results.

FIG. 10A is a table showing an illustrative optimization control spreadsheet 360. An optimization control spreadsheet is one of a number of ways for the user to provide the user control information 328 to the optimization program 318 (see, FIG. 9). In a first column 362, selected modules within the current circuit design may be listed as shown (see also, FIG. 11). In a second column 364, a particular optimization parameter may be provided. In the preferred embodiment, the optimization program may accept a number of optimization parameters. The optimization parameters may specify how a particular module within the design should be optimized. For example, a particular module may be optimized fully, pursuant to predefined rules, to maximize speed, to minimize area, or to skip optimization altogether. These are only exemplary optimization parameters, and it is contemplated that other predefined parameters may be defined.

In the illustrative optimization control spreadsheet shown in FIG. 10A, module-A has a corresponding optimization parameter of "dont-touch". This indicates that module-A should not be optimized by the optimization program. Likewise, module-E has a corresponding optimization parameter entitled "timing". This indicates that module-E should be optimized to minimize the time delay therethrough. Module-G has a corresponding optimization program of "design rules". This indicates that module-G should be optimized in accordance with a predefined set of rules (e.g. minimize capacitive loading and/or fanout).

FIG. 10B is a table showing an illustrative optimization control menu 366. Rather than providing an optimization control spreadsheet as shown in FIG. 10A, it is contemplated that the same or similar information may be provided in a menu. For example, all or a selected portion of the modules in a particular design may be listed in a column as shown in 368 (see FIG. 11). For each module listed, a series of selections may be provided as shown at 370. For example, the number of selections may include "dont-touch" (DT), "full" (FU), "area" (AR), "rules" (RU), and "timing" (TI). The user may then select the appropriate optimization parameter for each module as shown. The data processing system may then process the menu options and provide the result to the optimization program.

A further discussion of the optimization control spreadsheet and optimization control menu may be found in co-pending U.S. patent application Ser. No. 08/752,619, filed Nov. 19, 1996, entitled "Method and Apparatus for Providing Optimization Parameters to a Logic Optimizer Tool", which has been incorporated herein by reference.

FIG. 11A is a tree graph showing the design hierarchy of a typical circuit design database. The diagram is generally shown at 400. A high level module, module-A 402, may be provided. Module-A 402 may include references to top-level module-B 404, top-level module-C 406, and top-level module-D 408. In the exemplary embodiment, module-B 404 may contain references to module-E 410 and module-F 412. Similarly, module-C 406 may contain references to module-E 410 and module-F 412. Finally, module-D 408 may contain references to module-E 410, as shown.

High-level module-A 402 represents the module existing at the highest level in the hierarchy, which, in this case, is the entire circuit design. Top-level modules-B, C, and D are hierarchial modules existing within module-A 402. Modules-E and F exist at the lowest level in the hierarchy, and are referred to as "leaf cells" or "library components". It is recognized that in a typical design, the logic representation would be much more complex, any may contain many more levels of design hierarchy and hundreds or thousands of modules.

When a typical logic optimizer optimizes a design, it processes one module at a time starting with the hierarchial modules existing at the lowest level. A logic change in one of the low level modules can result in a re-implementation of the modules containing that module. For example, a logic change to module-E 410 could cause the logic optimizer to completely re-implement the logic within module-B 404, which in turn could cause re-implementation of module-A 402. This is highly undesirable. It would be much more desirable to re-optimize module-E 410 and incorporate the optimized result into module-B 404 without re-implementing module-B 404 or module-A 402.

FIG. 11B is a table showing the design hierarchy of the database shown in FIG. 11A, and an illustrative directory structure for storing each of the modules within the design hierarchy. The design hierarchy is summarized in the table shown at 430. The various levels are hierarchy are shown by using an indentation. For example, top-level module-B, module-C, and module-D have been indented relative to module-A. Further, module-E and module-F have been indented relative to module-B, module-C and module-D.

The illustrative directory structure is shown at 440, wherein all modules are stored in a single directory on a computer system. For example, all modules are stored in a directory entitled "/User/Project/Modules". Thus, module-A 402 includes links or references to /user/projects/modules/modules-B, /user/projects/modules/module-C, and /user/projects/modules/module-D, as shown. Similarly, module-B includes links or references to /user/projects/modules/modules-E and /user/projects/modules/module-F, as shown. This directory structure allows a single copy for each module, wherein that copy may be referenced by any number of other modules.

It is contemplated that this is only an illustrative directory structure, and that other directory structures can be utilized. For example, it is not necessary that all modules be within a single directory as shown. The directory structure that is utilized for a particular design is typically at the discretion of the circuit designers.

As indicated above, it is contemplated that the previous revisions of each module (not shown) may be stored within the data processing system. These previous revisions may be used to determine which portions of a current revision of a circuit design have changed from the previous revision. In a preferred embodiment, the previous revisions are stored in a separate directory from the current revisions.

Figure 12:
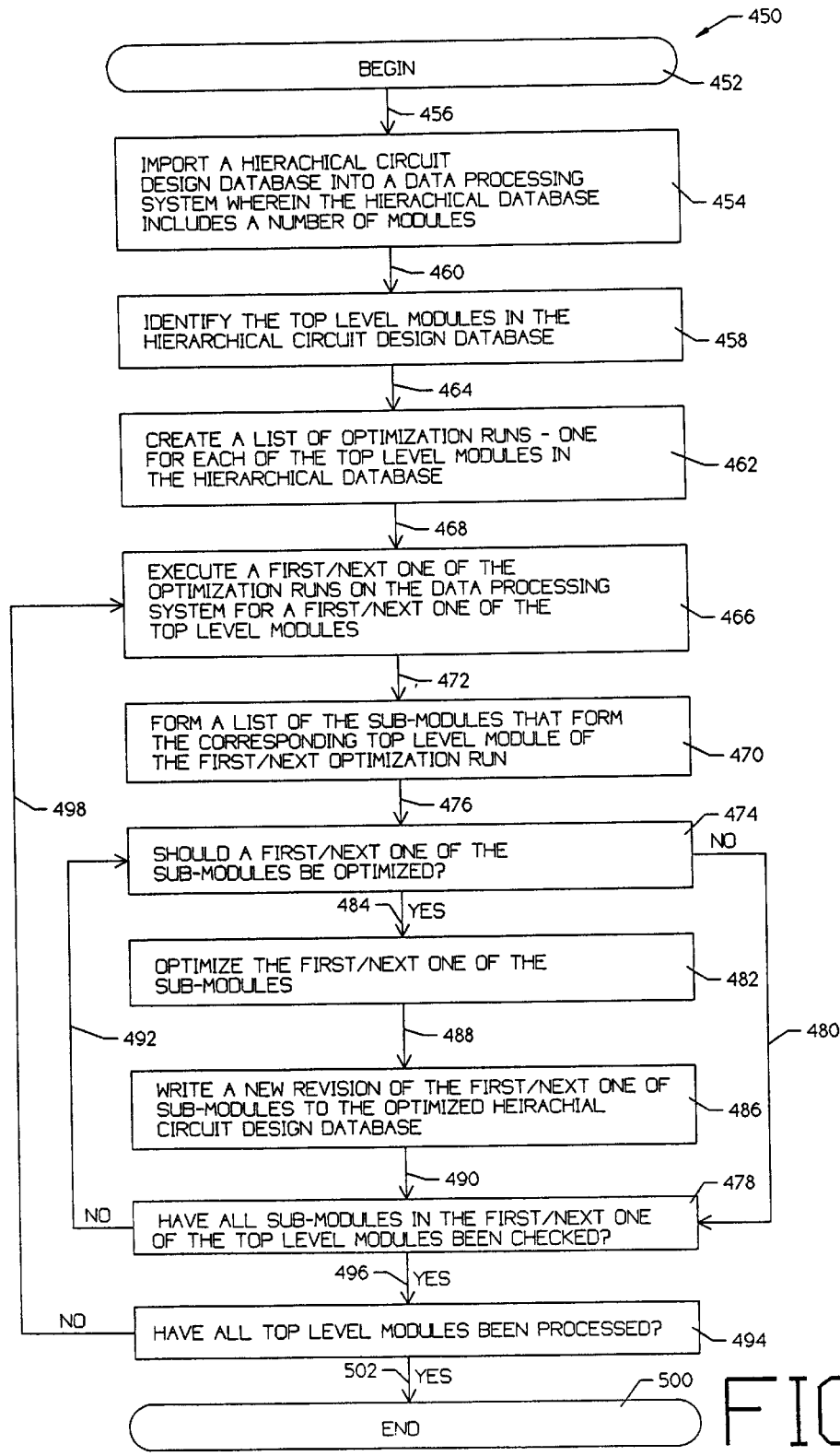
FIG. 12 is a flow diagram showing an exemplary optimization run set for a hierarchical circuit design database.

FIG. 12 is a flow diagram showing an exemplary optimization run set for a hierarchial circuit design database. The flow diagram is generally shown at 450. The algorithm is entered at element 452, wherein control is passed to element 454 via interface 456. Element 454 imports a hierarchial circuit design database into a data processing system, wherein the hierarchial database includes a number of modules. Control is then passed to element 458 via interface 460. Element 458 identifies the top level modules in the hierarchial circuit design database. Control is then passed to element 462 via interface 464. Element 462 creates a list of optimization runs including one optimization run for each of the top level modules in the hierarchial database. Control is then passed to element 466 via interface 468. Element 466 executes a first/next one of the optimization runs on the data processing system for a first/next one of the top level modules. Control is then passed to element 470 via interface 472. Element 470 forms a list of the sub-modules that are referenced by the corresponding top level module of the first/next optimization run. Control is then passed to element 474 via interface 476. Element 474 determines whether a first/next one of the sub-modules should be optimized. If the first/next one of the sub-modules should be optimized, control is passed to element 482 via interface 484. Element 482 optimizes the first/next one of the sub-modules. Control is then passed to element 486 via interface 488. Element 486 writes a new revision of the first/next one of the sub-modules to the optimized hierarchial circuit design database. Control is then passed to element 478 via interface 490.

Referring back to element 474, if the first/next one of the sub-modules should not be optimized, control is passed to element 478 via interface 480. Element 478 determines whether all of the sub-modules in the first/next one of the top level modules have been checked. If all of the sub-modules in the first/next one of the top level modules have not been checked, control is passed back to element 474 via interface 492. If, however, all of the sub-modules in the first/next one of the top level modules have been checked, control is passed to element 494 via interface 496.

Element 494 determines whether all top level modules have been processed. If all top level modules have not been processed, control is passed back to element 466 via interface 498. If, however, all top level modules have been processed, control is passed to element 500 via interface 502, wherein the algorithm is exited.

Figure 13:
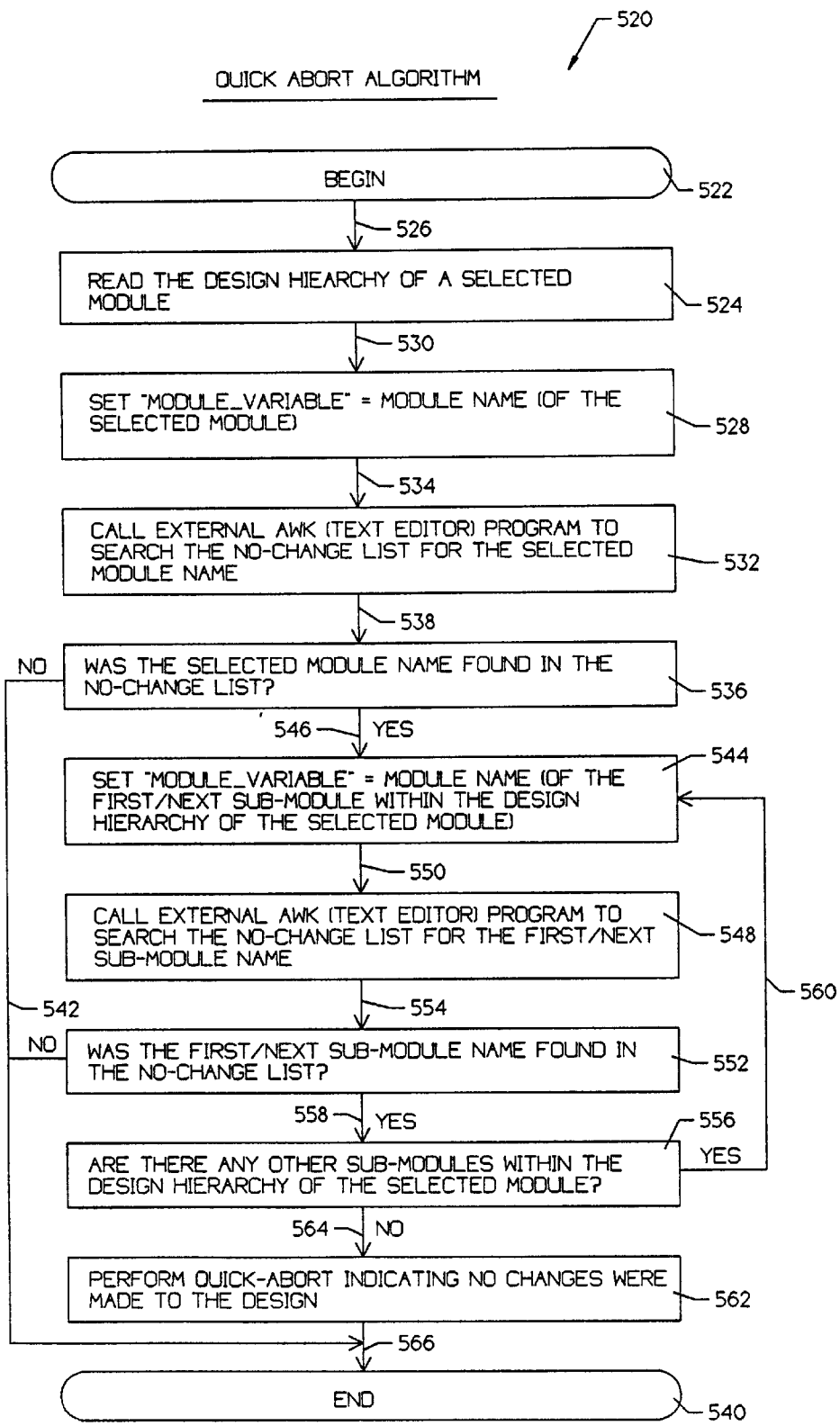
FIG. 13 is a flow diagram showing a quick-abort routine in accordance with the present invention.

FIG. 13 is a flow diagram showing a quick-abort routine in accordance with the present invention. It may be desirable to check to see if the top level modules have any sub-modules that have changed from the previous revision, before executing the algorithm described with reference to FIG. 12. This is known as the quick-abort algorithm 520.

The quick-abort algorithm is entered at element 522, wherein control is passed to element 524 via interface 526. Element 524 reads the design hierarchy of a selected module. Control is then passed to element 528 via interface 530.

Element 528 sets a variable "MODULE_VARIABLE" equal to the module name of the selected module. Control is then passed to element 532 via interface 534. Element 532 calls an external text editor program to search the no-change list for the selected module name. Control is then passed to element 536 via interface 538. Element 536 determines whether the selected module name was found in the no-change list. If the module name was not found in the no-change list, control is passed to element 540 via interface 542, wherein the algorithm is exited.

If, however, the selected module name was found in the no-change list, control is passed to element 544 via interface 546. Element 544 sets the variable "MODULE_VARIABLE" equal to the module name of the first/next sub-module within the design hierarchy of the selected module. Control is then passed to element 548 via interface 550. Element 548 calls the external text editor program to search the no-change list for the first/next sub-module name. Control is then passed to element 552 via interface 554. Element 552 determines whether the first/next sub-module name was found in the no-change list. If the first/next sub-module name was not found in the no-change list, control is passed to element 540 via interface 542, wherein the algorithm is exited.

If, however, the first/next sub-module name was found in the no-change list, control is passed to element 556 via interface 558. Element 556 determines whether there are any other sub-modules within the design hierarchy of the selected module. If there are other sub-modules within the design hierarchy of the selected module, control is passed back to element 544 via interface 560. However, if there are no other sub-modules within the design hierarchy of the selected module, control is passed to element 562, via interface 564. Element 562 performs a quick-abort function, indicating that no changes were made to the design. Control is then passed to element 540 via interface 566, wherein the algorithm is exited.

Figure 14:
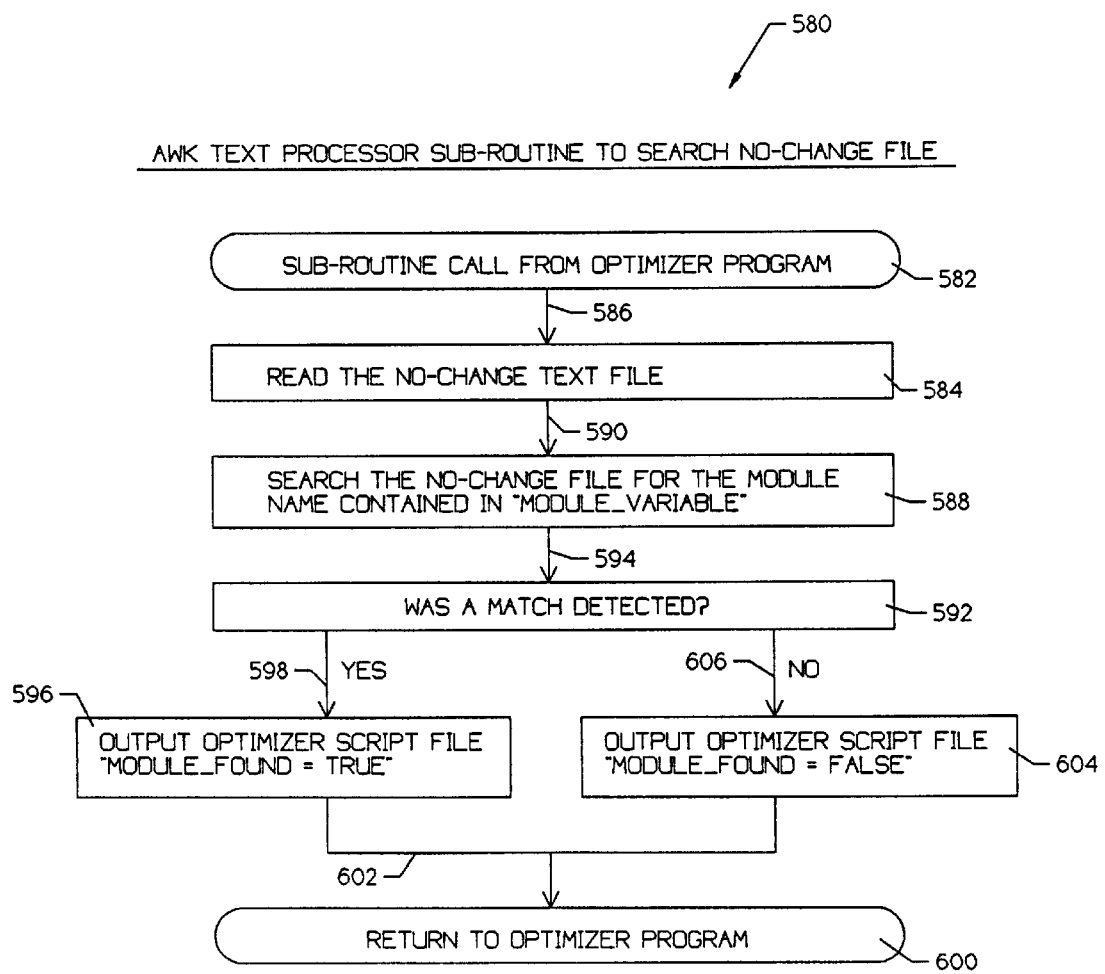
FIG. 14 is a flow diagram showing an exemplary text processor sub-routine for searching a no-change list.

FIG. 14 is a flow diagram showing an exemplary text editor sub-routine for searching the no-change list. The algorithm is shown generally at 580. The sub-routine is initiated by a call from an optimizer program as shown at 582. This can most easily be accomplished by utilizing a text editor that is running on the same data processor as the optimizer program. In a preferred embodiment, the AWK text editor is utilized.

Control is then passed to element 584 via interface 586. Element 584 reads the no-change test file. Control is then passed to element 588 via interface 590. Element 588 searches the no-change file for the module name contained in "MODULE_VARIABLE" (see FIG. 13). Control is then passed to element 592 via interface 594. Element 592 determines whether a match was detected. If a match was detected, control is passed to element 596 via interface 598. Element 596 outputs an optimizer script file command, such as "MODULE_FOUND=true". Control is then passed to element 600 via interface 602, wherein the sub-routine returns to the optimizer program.

Referring back to element 592, if a match was not detected, control is passed to element 604 via interface 606. Element 604 outputs an optimizer script command, such as "MODULE_FOUND=false". Control is then passed to element 600, via interface 602, wherein the sub-routine returns control to the optimizer program.

Figure 15:
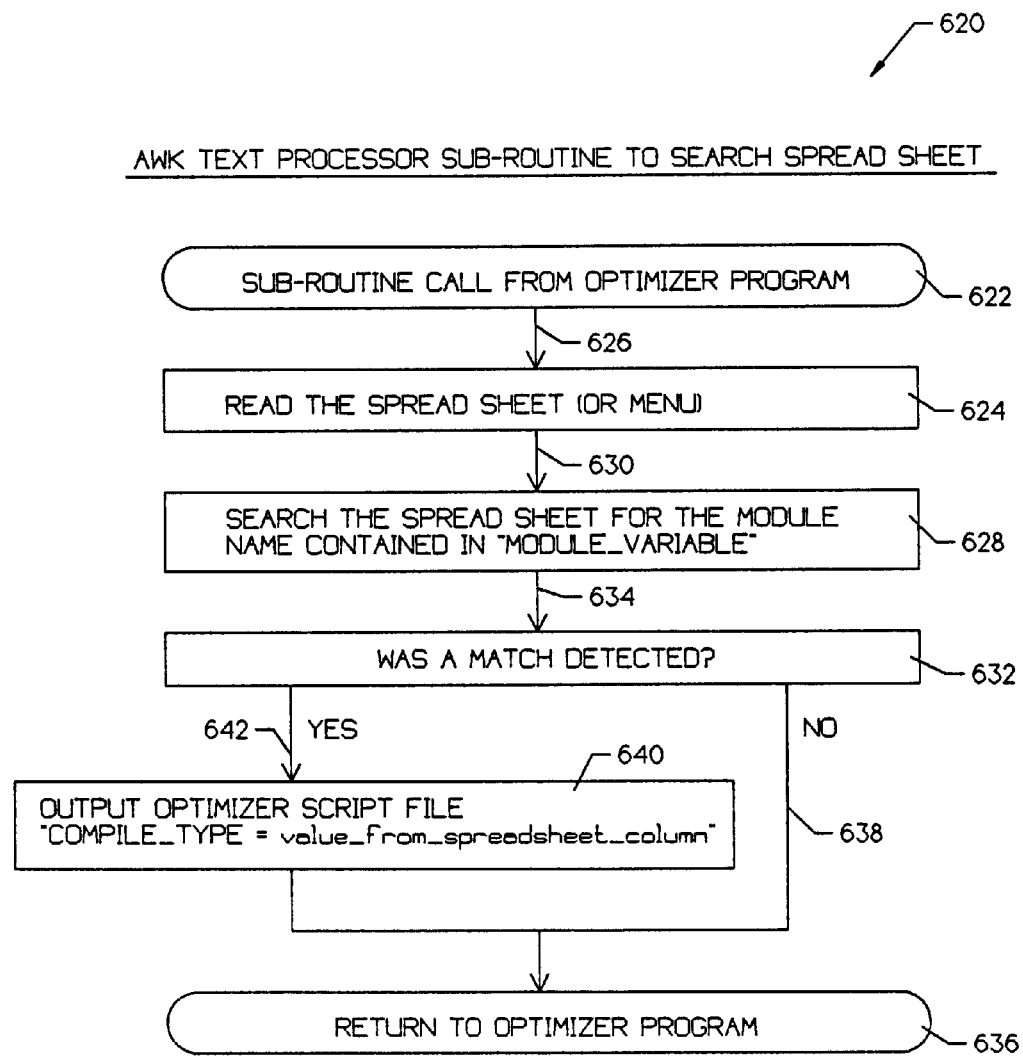
FIG. 15 is a flow diagram showing an exemplary text processor sub-routine for searching a user supplied spread sheet.

FIG. 15 is a flow diagram showing an exemplary text processor sub-routine for searching a user supplied spreadsheet. In a preferred embodiment, the user supplied spreadsheet is created using the EXCEL spreadsheet program available from Microsoft Corporation. The EXCEL spreadsheet is then written out in a comma delimited format or a comma separated values (CSV) format. However, it is contemplated that any spreadsheet program can be used to create the user supplied spreadsheet.

The sub-routine is generally shown at 620. The sub-routine is initiated by a call from an optimizer program as shown at 622. Control is then passed to element 624 via interface 626. Element 624 reads the spreadsheet or menu data. Control is then passed to element 628 via interface 630. Element 628 searches the spreadsheet data for the module name contained in "MODULE_VARIABLE" (see FIG. 13). Control is then passed to element 632 via interface 634. Element 632 determines whether a match was detected. If a match was detected, control is passed to element 640 via interface 642. Element 640 outputs an optimizer script command such as "COMPILE_TYPE =value=from_ spreadsheet_column". The value_from_spreadsheet_ column variable may be the desired parameter value from the corresponding spreadsheet column, for example the parameter "timing" that corresponds to module-E in FIG. 10A. Control is then passed to element 636 via interface 638, wherein the sub-routine returns control to the optimizer program.

Referring back to element 632, if a match was not detected, control is passed to element 636 via interface 638, wherein the sub-routine returns control the optimizer program.

Figure 16:
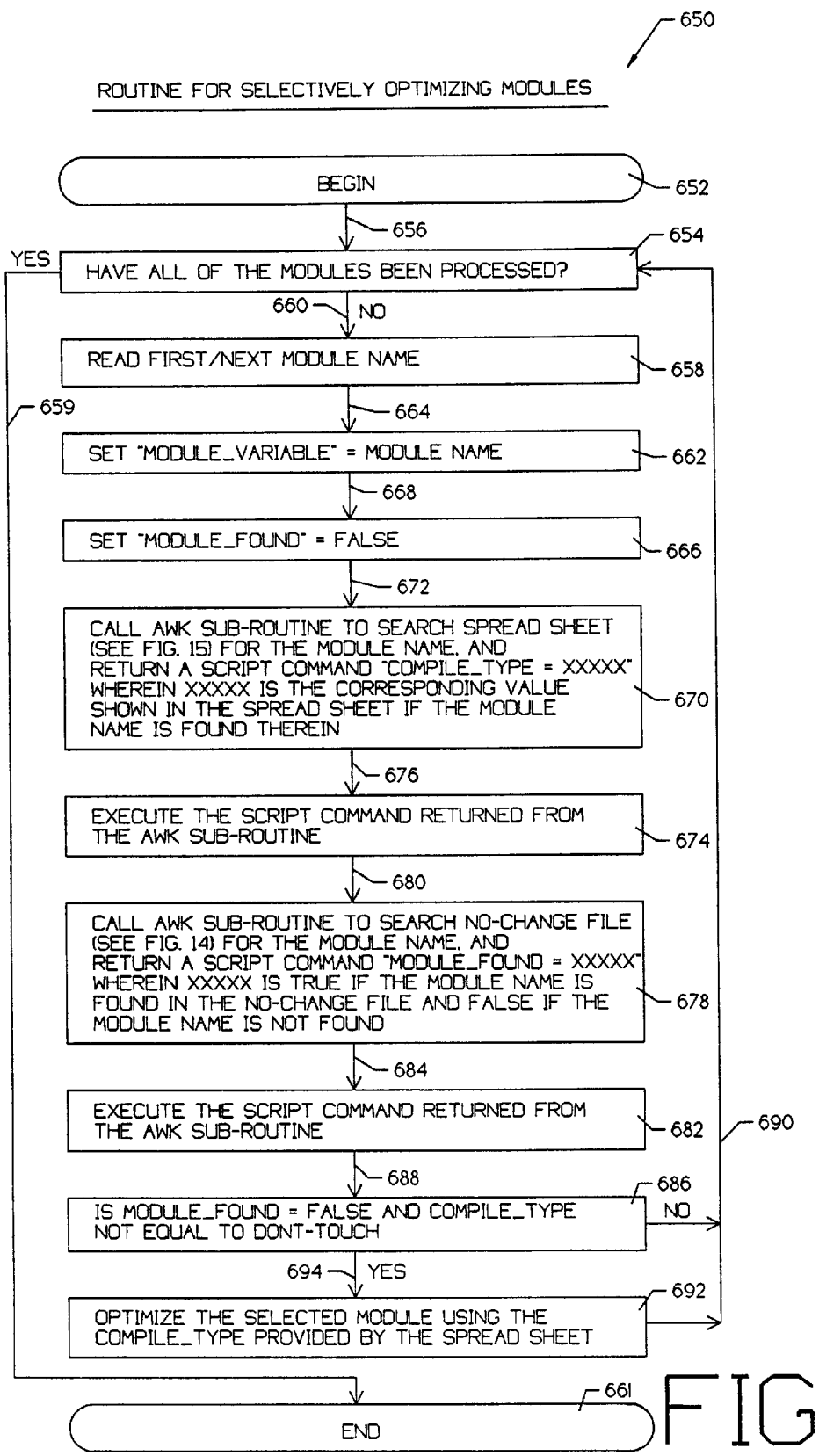
FIG. 16 is a flow diagram showing an exemplary routine for selectively optimizing modules within a hierarchical design database.

FIG. 16 is a flow diagram showing an exemplary routine for selectively optimizing modules within a hierarchial design database. The algorithm is generally shown at 650. The algorithm is entered at element 652, wherein control is passed to element 654 via interface 656. Element 654 determines whether all of the modules have been processed. If all of the modules have been processed, control is passed to element 661 via interface 659, wherein the algorithm is exited.

Referring back to element 654, if all the modules have not been processed, control is passed to element 658 via interface 660. Element 658 reads the first/next module name. Control is then passed to element 662 via interface 664. Element 662 sets the variable "MODULE_VARIABLE" equal to the first/next module name. Control is then passed to element 666 via interface 668. Element 666 sets the variable "MODULE_FOUND" equal to false. Control is then passed to element 670 via interface 672. Element 670 calls a text editor sub-routine to search a spreadsheet database (see FIG. 15) for the module name, and return a script command "COMPILE_TYPE=XXXXX", wherein XXXXX is the corresponding value shown in the spreadsheet, but only if the module name is found therein. Control is then passed to element 674 via interface 676. Element 674 executes the script command returned from the text editor sub-routine. Control is then passed to element 678 via interface 680. Element 678 calls the text editor sub-routine to search the no-change file (see FIG. 14) for the module name, and to return a script command "MODULE_ FOUND=XXXXX", wherein XXXXX equals true if the module name is found in the no-change file, and false if the module name is not found. Control is then passed to element 682 via interface 684. Element 682 executes the script command returned from the text editor sub-routine. Control is then passed to element 686 via interface 688. Element 686 determines whether the "MODULE_FOUND" parameter equals false and the "COMPILE_TYPE" parameter does not equal dont-touch. If the "MODULE_FOUND" parameter is equal to true or the "COMPILE_TYPE" parameter is equal to dont-touch, control is passed back to element 654 via interface 690. If, however, the "MODULE_FOUND" parameter is equal to false and the "COMPILE_TYPE" parameter is not equal to dont-touch, control is passed to element 692 via interface 694. Element 692 optimizes the selected module using the "COMPILE_TYPE" parameter provided by the spreadsheet. Control is then passed back to element 654 via interface 690.

Having thus described the preferred embodiments of the present invention, those of skill in the art will readily appreciate that the teachings found herein may be applied to yet other embodiments within the scope of the claims hereto attached.

We claim:

1. A data processing system for incrementally optimizing a current version of a circuit design, wherein the current version of the circuit design is stored in a current circuit design database, and includes a number of incremental changes from a previous version of the circuit design, the previous version of the circuit design is stored in a previous circuit design database, the previous circuit design database further includes a corresponding previously optimized circuit design, the data processing system comprising:
   a. determining means for comparing the current circuit design database and the previous circuit design database to identify the number of incremental changes therebetween;
   b. merging means coupled to said determining means for merging selected ones of the number of incremental changes and the previously optimized circuit design, thereby resulting in a partially optimized circuit design; and
   c. optimizing means coupled to said merging means for optimizing at least a portion of the partially optimized circuit design, including selected ones of the number of incremental changes.

2. A data processing system according to claim 1, wherein said merging means includes substituting means for substituting a number of portions of the previously optimized circuit design with corresponding ones of the number of incremental changes.

3. A data processing system according to claim 1, wherein said determining means further identifies a no-change list, wherein the no-change list identifies selected portions of the current circuit design database that have not changed from the previous circuit design database.

4. A data processing system according to claim 3, wherein said optimizing means is further coupled to said merging means, said optimizing means optimizing the partially optimized circuit design except for those portions identified by said no-change list.

5. A data processing system according to claim 1, wherein said determining means compares the current circuit design database and the previous circuit design database using a cone-graph compare algorithm.

6. A data processing system according to claim 1, wherein the current circuit design database includes a number of sub-portions and the previous circuit design database includes a number of corresponding sub-portions, and wherein selected ones of the sub-portions are assigned an updated revision identifier by a revision control block.

7. A data processing system according to claim 6, wherein said determining means respectively compares the revision control identifiers of sub-portions of the current circuit design database with corresponding sub-portions of the previous circuit design database.

8. A data processing system according to claim 1, wherein said optimizing means is further coupled to an optimization control block, wherein said optimization control block provides a number of optimization control parameters to said optimizing means, said optimization control parameters influencing the optimization methodology of said optimizing means.

9. A data processing system according to claim 8, wherein selected ones of said optimization control parameters indicate that selected portions of the partially optimized circuit design are to be optimized to minimize power consumption.

10. A data processing system according to claim 8, wherein selected ones of said optimization control parameters indicate that selected portions of the partially optimized circuit design are to be optimized to maximize performance.

11. A data processing system according to claim 8, wherein selected ones of said optimization control parameters indicate that selected portions of the partially optimized circuit design are to be optimized to minimize area.

12. A data processing system according to claim 8, wherein selected ones of said optimization control parameters indicate that selected portions of the partially optimized circuit design are to be optimized to conform to a predefined set of rules.

13. A data processing system according to claim 8, wherein said optimization control parameters are defined by a user.

14. A data processing system according to claim 13, wherein said user defines said optimization control parameters via a spread sheet interface.

15. A data processing system according to claim 13, wherein said user defines said optimization control parameters via a menu interface.

16. A data processing system for incrementally optimizing a current version of a circuit design, wherein the current version of the circuit design is stored in a current circuit design database, and includes a number of incremental changes from a previous version of the circuit design, the previous version of the circuit design is stored in a previous circuit design database, the previous circuit design database further includes a corresponding previously optimized circuit design, the data processing system comprising:
   a. determining means for comparing the current circuit design database and the previous circuit design database to identify the number of incremental changes therebetween;
   b. optimizing means coupled to said determining means for optimizing selected ones of the number of incremental changes, thereby resulting in a number of optimized incremental changes; and
   c. merging means coupled to said optimizing means for merging selected ones of the number of optimized incremental changes and selected portions of the previous optimized circuit design.

17. A method for incrementally optimizing a current version of a circuit design operable on a computer wherein the current version of the circuit design is represented in a current circuit design database, and includes a number of incremental changes from a previous version of the circuit design, the previous version of the circuit design is represented in a previous circuit design database, the previous circuit design database further includes a corresponding previously optimized circuit design, the method comprising the steps of:
   a. comparing the current circuit design database and the previous circuit design database to identify at least some of the number of incremental changes therebetween;

b. merging selected ones of the number of incremental changes and selected portions of the previous optimized circuit design, thereby resulting in a partially optimized circuit design; and c. selectively optimizing at least a portion of the partially optimized circuit design, including selected ones of the number of incremental changes.

18. A method according to claim 17, wherein said merging step includes a substituting step for substituting a number of portions of the previously optimized circuit design with corresponding ones of the number of incremental changes.

19. A method according to claim 17, wherein said comparing step further identifies a no-change list, wherein the no-change list identifies selected portions of the current circuit design database that have not changed from the previous circuit design database.

20. A method according to claim 19, wherein said optimizing step optimizes the partially optimized circuit design except for those portions identified by said no-change list.

21. A method according to claim 17, wherein said comparing step compares the current circuit design database and the previous circuit design database using a cone-graph compare algorithm.

22. A method according to claim 17, further comprising a revision control step, wherein the current circuit design database includes a number of sub-portions and the previous circuit design database includes a number of corresponding sub-portions, and wherein selected ones of these sub-portions are assigned an updated revision identifier during the revision control step.

23. A method according to claim 22, wherein said comparing step compares the revision control identifiers of selected sub-portions of the current circuit design database with selected corresponding sub-portions of the previous circuit design database.

24. A method according to claim 17, further comprising a providing step wherein said providing step provides a number of optimization control parameters that affect the optimization methodology of said optimizing step.

25. A method according to claim 24, wherein said optimization control parameters are defined by a user.

26. A method according to claim 25, wherein said user defines said optimization control parameters via a spread sheet interface.

27. A method according to claim 25, wherein said user defines said optimization control parameters via a menu interface.

28. A method according to claim 17, further including the steps of:

a. determining if there are any incremental changes in a selected portion of the current circuit design database; and b. skipping the optimization step for said selected portion of the current circuit design database if the determining step (a) determines that there are no incremental changes in the selected portion of the current circuit design database.

29. A method for incrementally optimizing a current version of a circuit design operable on a computer, wherein the current version of the circuit design is represented in a current circuit design database, and includes a number of incremental changes from a previous version of the circuit design, the previous version of the circuit design is represented in a previous circuit design database, the previous circuit design database further includes a corresponding previously optimized circuit design, the method comprising the steps of:

a. comparing the current circuit design database and the previous circuit design database to identify at least some of the number of incremental changes therebetween;

b. optimizing selected ones of the number of incremental changes, thereby resulting in a number of optimized incremental changes; and c. merging selected ones of the optimized incremental changes and selected portions of the previously optimized circuit design.

30. A method according to claim 29, further including the steps of:

a. determining if there are any incremental changes in a selected portion of the current circuit design database; and b. skipping the optimization step for said selected portion of the current circuit design database if the determining step (a) determines that there are no incremental changes in the selected portion of the current circuit design database.

31. A data processing system according to claim 1, wherein said optimizing means operates on said circuit design at a structural level.

* * * * *